United States Patent
Hung et al.

(10) Patent No.: US 9,567,204 B2
(45) Date of Patent: Feb. 14, 2017

(54) MICROELECTROCHEMICAL SYSTEMS (MEMS) DEVICE HAVING A SEAL LAYER ARRANGED OVER OR LINING A HOLE IN FLUID COMMUNICATION WITH A CAVITY OF THE MEMS DEVICE

(71) Applicant: Taiwan Semiconductor Manufacturing Co., Ltd., Hsin-Chu (TW)

(72) Inventors: Chia-Ming Hung, Taipei (TW); Shao-Chi Yu, Hsinchu (TW); Hsiang-Fu Chen, Zhubei (TW); Wen-Chuan Tai, Hsinchu (TW); Hsin-Ting Huang, Bade (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/472,636

(22) Filed: Aug. 29, 2014

(65) Prior Publication Data

US 2016/0060103 A1 Mar. 3, 2016

(51) Int. Cl.
*B81B 7/00* (2006.01)
*B81C 1/00* (2006.01)

(52) U.S. Cl.
CPC ......... *B81B 7/0038* (2013.01); *B81C 1/00238* (2013.01)

(58) Field of Classification Search
CPC ............................. B81B 7/0038; B81B 7/0041
See application file for complete search history.

(56) References Cited

U.S. PATENT DOCUMENTS

| | | | |
|---|---|---|---|
| 6,372,619 B1 | 4/2002 | Huang et al. | |
| 6,936,918 B2 | 8/2005 | Harney et al. | |
| 7,030,494 B2 | 4/2006 | Aoki | |
| 7,659,150 B1 * | 2/2010 | Monadgemi | B81C 1/00293 257/E23.193 |

(Continued)

OTHER PUBLICATIONS

Fan, et al. "Low Temperature Wafer-Level Metal Thermo-Compression Bonding Technology for 3D Integration." InTech, published in 2012.

(Continued)

*Primary Examiner* — Anh Mai
(74) *Attorney, Agent, or Firm* — Eschweiler & Associates, LLC

(57) ABSTRACT

A method for manufacturing a microelectromechanical systems (MEMS) device is provided. According to the method, a semiconductor structure is provided. The semiconductor structure includes an integrated circuit (IC) substrate, a dielectric layer arranged over the IC substrate, and a MEMS substrate arranged over the IC substrate and the dielectric layer to define a cavity between the MEMS substrate and the IC substrate. The MEMS substrate includes a MEMS hole in fluid communication with the cavity and extending through the MEMS substrate. A sealing layer is formed over or lining the MEMS hole to hermetically seal the cavity with a reference pressure while the semiconductor structure is arranged within a vacuum having the reference pressure. The semiconductor structure resulting from application of the method is also provided.

20 Claims, 18 Drawing Sheets

(56) References Cited

U.S. PATENT DOCUMENTS

| | | | |
|---|---|---|---|
| 8,497,557 B2* | 7/2013 | Tanaka | B81B 7/0041 257/415 |
| 8,507,358 B2 | 8/2013 | Chou | |
| 8,525,278 B2 | 9/2013 | Chu et al. | |
| 8,587,077 B2 | 11/2013 | Chen | |
| 8,647,963 B2 | 2/2014 | Lee et al. | |
| 8,716,051 B2 | 5/2014 | Lin et al. | |
| 8,716,852 B2 | 5/2014 | Shu et al. | |
| 8,729,646 B2 | 5/2014 | Chu et al. | |
| 8,866,238 B2 | 10/2014 | Classen | |
| 9,227,841 B2 | 1/2016 | Huang et al. | |
| 2005/0250253 A1* | 11/2005 | Cheung | B81C 1/00293 438/125 |
| 2009/0108381 A1 | 4/2009 | Buchwalter et al. | |
| 2010/0006959 A1 | 1/2010 | Kim et al. | |
| 2010/0273286 A1 | 10/2010 | Liang et al. | |
| 2012/0025389 A1 | 2/2012 | Chu et al. | |
| 2012/0098074 A1* | 4/2012 | Lin | B81C 1/00333 257/414 |
| 2012/0125747 A1* | 5/2012 | Chu | H01P 1/127 200/181 |
| 2012/0248615 A1 | 10/2012 | Chien et al. | |
| 2013/0043510 A1 | 2/2013 | Shu et al. | |
| 2013/0093084 A1 | 4/2013 | Chen et al. | |
| 2013/0105923 A1 | 5/2013 | Yu et al. | |
| 2013/0127036 A1 | 5/2013 | Kuo et al. | |
| 2013/0213139 A1 | 8/2013 | Chen et al. | |
| 2013/0214400 A1* | 8/2013 | Shu | B81B 7/0038 257/682 |
| 2013/0277777 A1 | 10/2013 | Chang et al. | |
| 2014/0042562 A1 | 2/2014 | Chu et al. | |
| 2014/0117475 A1 | 5/2014 | Classen et al. | |
| 2014/0203421 A1 | 7/2014 | Shu et al. | |
| 2015/0035089 A1 | 2/2015 | Liu et al. | |
| 2015/0175406 A1 | 6/2015 | Lin et al. | |
| 2015/0175407 A1 | 6/2015 | Cheng et al. | |
| 2015/0197419 A1 | 7/2015 | Cheng et al. | |
| 2015/0329351 A1 | 11/2015 | Cheng et al. | |

OTHER PUBLICATIONS

Lu, et al. "Mechanisms Underlying the Unstable Contact Resistance of Conductive Adhesives." IEEE Transactions on Electronics Pacjaging Manufacturing, vol. 22, No. 3, Jul. 1999.

Fukuta, et al. "Vapor Hydrofluoric Acid (HF) Sacrificial Release Technique for Mems Using Labware." Japanese Journal of Applied Physics. Jan. 2003.

U.S. Appl. No. 14/645,650, filed Mar. 12, 2015.

U.S. Appl. No. 14/276,445, filed May 13, 2014.

U.S. Appl. No. 14/225,733 filed with the USPTO on Mar. 26, 2014.

Non Final Office Action Dated Apr. 18, 2016 U.S. Appl. No. 14/276,445.

Notice of Allowance Dated Aug. 12, 2016 U.S. Appl. No. 14/276,445.

* cited by examiner

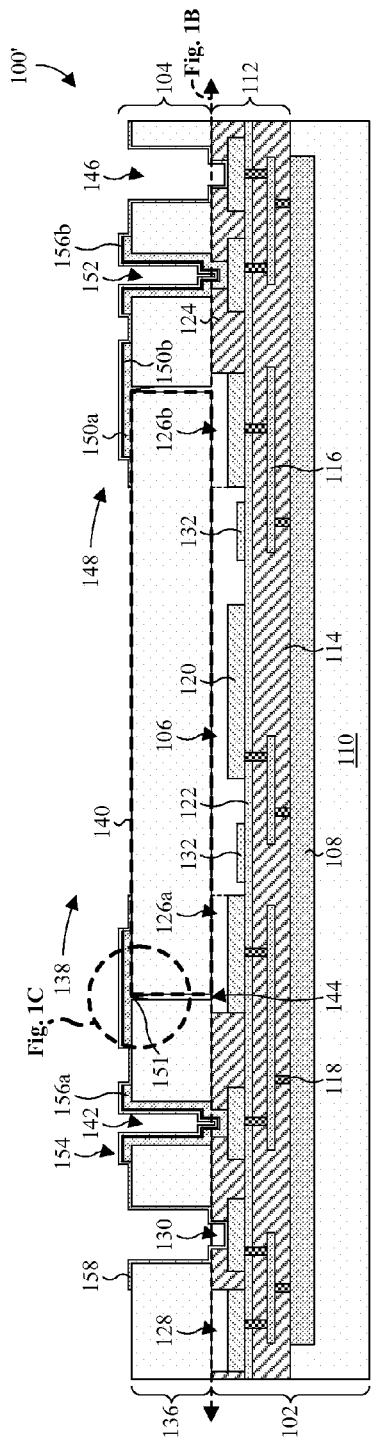
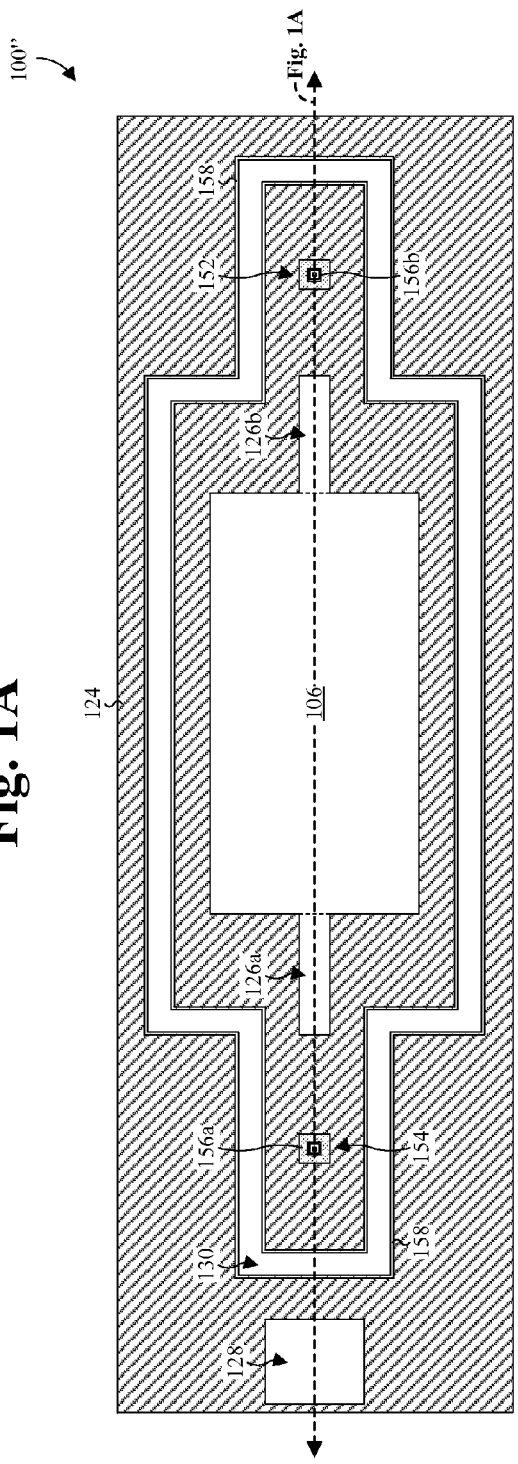
Fig. 1A
Fig. 1B

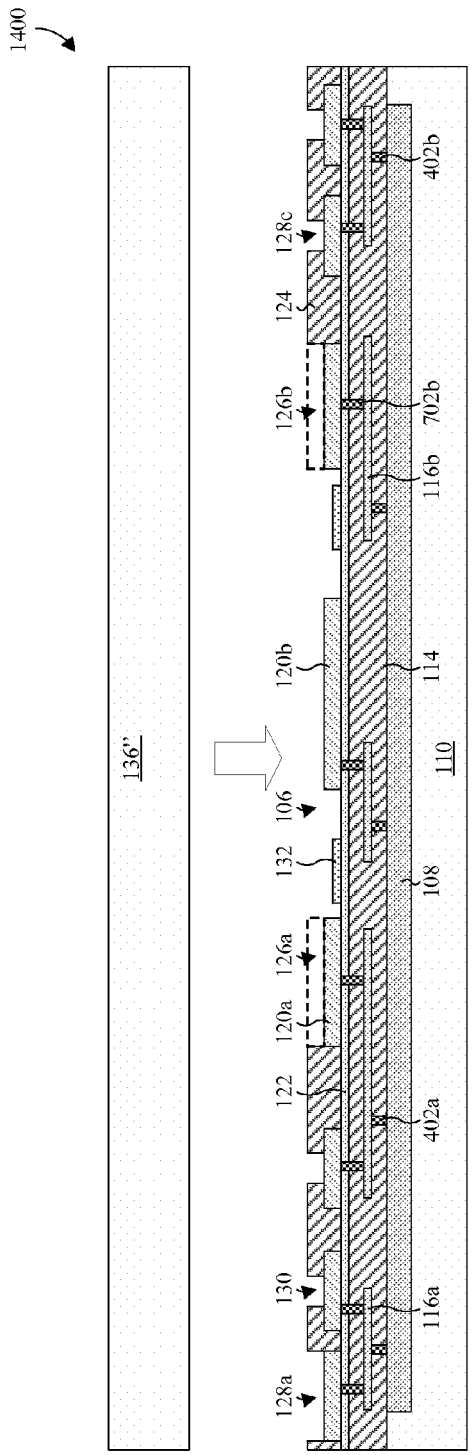
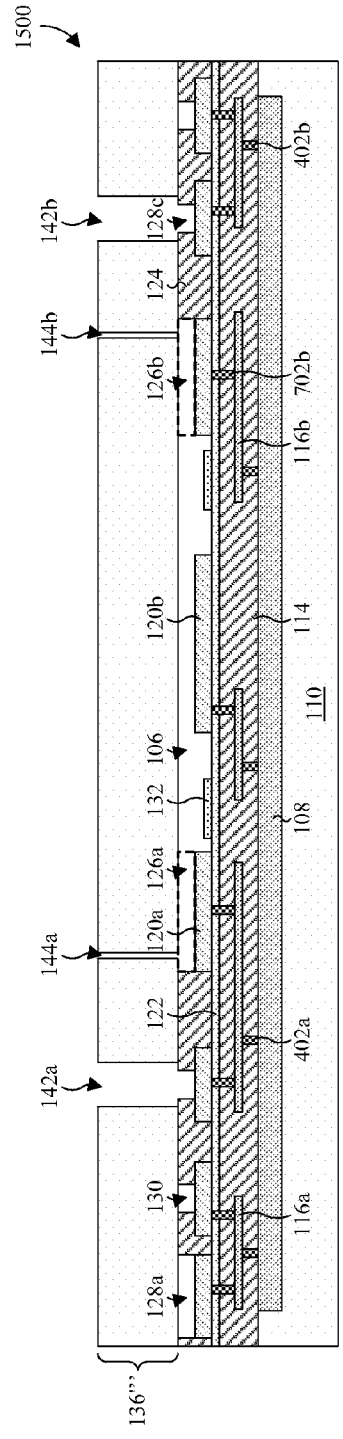
Fig. 14
Fig. 15

MICROELECTROCHEMICAL SYSTEMS (MEMS) DEVICE HAVING A SEAL LAYER ARRANGED OVER OR LINING A HOLE IN FLUID COMMUNICATION WITH A CAVITY OF THE MEMS DEVICE

BACKGROUND

Microelectromechanical system (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of some embodiments of a semiconductor structure including a microelectromechanical systems (MEMS) device with a high vacuum seal according to aspects of the present disclosure.

FIG. 1B illustrates a top view of some embodiments of the semiconductor structure of FIG. 1A.

FIGS. 4-30 illustrate a series of cross-sectional views of some embodiments of a semiconductor structure at various stages of manufacture, the semiconductor structure including a MEMS device with a high vacuum seal according to aspects of the present disclosure.

DETAILED DESCRIPTION

Figure 1C:
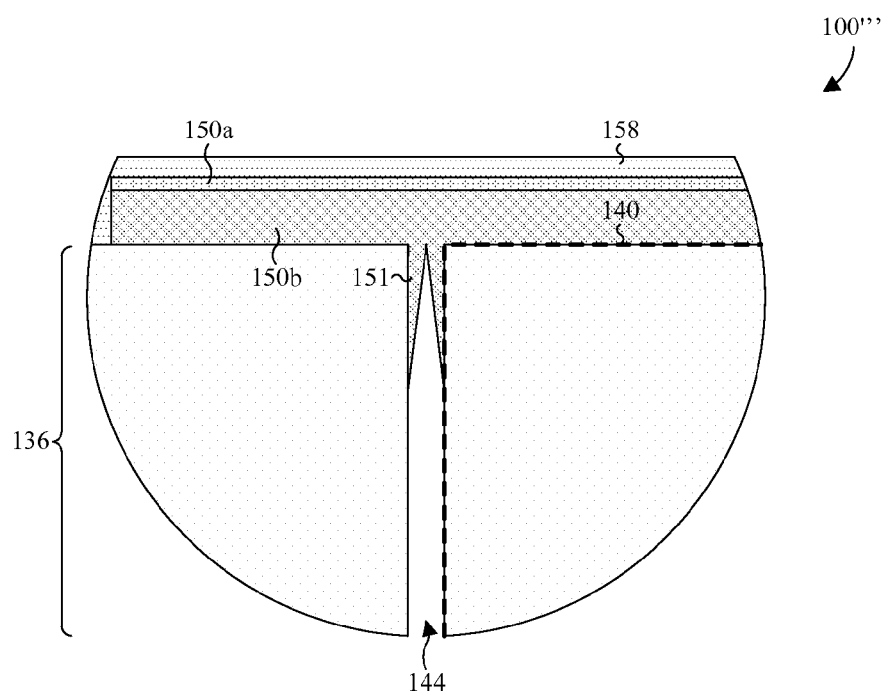
FIG. 1C illustrates an enlarged, cross-sectional view some embodiments of the semiconductor structure within the dashed circle of FIG. 1A.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not, however, intended to be descriptive of the corresponding element. For example, a substrate may be referenced as a first substrate in connection with a first set of one or more drawings and subsequently referenced as a second substrate in connection with a second set of one or more drawings.

Modern day electronic devices are increasingly incorporating microelectromechanical systems (MEMS) devices. One type of MEMS device, the pressure sensor, includes a flexible membrane arranged over a cavity hermetically sealed with a reference pressure. Assuming the reference pressure is steady, the flexible membrane deflects in proportion to the difference between the environmental pressure and the reference pressure. During the manufacture of an MEMS pressure sensor device, the cavity is typically sealed hermetically by a eutectic bond or a fusion bond.

When hermetically sealing a cavity of a MEMS pressure sensor device by a eutectic bond, a semiconductor structure having a MEMS substrate bonded to a complementary metal-oxide-semiconductor (CMOS) substrate is provided. The MEMS substrate is typically bonded to the CMOS substrate by a fusion bond and includes a MEMS device structure corresponding to the MEMS pressure sensor device. Further, the cavity is arranged between the CMOS substrate and the MEMS substrate below a flexible membrane of the MEMS pressure sensor device. A cap substrate is then provided and bonded to the MEMS substrate by the eutectic bond to hermetically seal the cavity with a reference pressure.

When hermetically sealing a cavity of a MEMS pressure sensor device by a fusion bond, a semiconductor structure including a CMOS substrate and an interconnect structure arranged over the CMOS substrate is provided. The semiconductor structure includes the cavity arranged between the CMOS substrate and the interconnect structure. A MEMS substrate including a MEMS device structure corresponding to the MEMS pressure sensor device is then provided and bonded to the CMOS substrate by a fusion bond to hermetically seal the cavity below a flexible membrane of the MEMS pressure sensor device and with a reference pressure.

A challenge with forming a MEMS pressure sensor device with eutectic bonding is that the device package is constrained by the height of the substrate stack. As described above, eutectic bonding employs a cap substrate to seal the cavity. This adds additional height relative to fusion bonding, which does not employ a cap substrate. Further, eutectic bonding induces stress in the device package that can cause slight deflections in the flexible membrane. This induced stress is exacerbated by temperature variations and can affect the performance (e.g., accuracy) of the MEMS pressure sensor device. Even more, eutectic bonding introduces additional costs relative to fusion bonding due to the need to for a cap substrate. Moreover, eutectic bonding limits the ability to pack MEMS pressure sensor devices on a MEMS substrate due to margins needed around MEMS pressure sensor devices for eutectic bonding.

A challenge with forming a MEMS pressure sensor device with fusion bonding is that the reference pressure is limited and too high for some devices (i.e., the vacuum level in the hermetic sealed cavity is too low). Further, the reference pressure is more susceptible to temperature variations than the lower reference pressure achievable with eutectic bonding. As temperatures increases or decreases, gases in the hermetic cavity expand and contract. This causes the reference pressure to vary and can affect the performance of the MEMS pressure sensor device. Even more, the reference pressures of bulk manufactured MEMS pressure sensor devices are subject to large variations.

In view of the foregoing, the present disclosure is directed to an improved method for hermetically sealing a cavity of an MEMS device, typically a MEMS pressure sensor device, with a reference pressure. According to the improved method, a semiconductor structure having a MEMS substrate bonded to a CMOS substrate is provided. The MEMS substrate is typically bonded to the CMOS substrate by a fusion bond and includes a MEMS device structure corresponding to the MEMS device. Further, a cavity is arranged between the CMOS substrate and the MEMS substrate, typically below a flexible membrane of the MEMS device. The cavity is open by a vent hole extending through the MEMS substrate. After receiving the semiconductor structure, the cavity is hermetically sealed by forming a plug and/or sealing layer over the vent hole with a film deposition device having the ability to form a film in a vacuum with a set pressure. The film deposition device is, for example, a chemical vapor deposition (CVD) device or a physical vapor deposition (PVD) device. By setting the pressure for the film deposition device to the reference pressure, the cavity can be hermetically sealed with the reference pressure.

Hermetically sealing the cavity according to the improved method can advantageously reduce the reference pressure in the hermetic cavity relative to fusion bonding. For example, the improved method can reduce the reference pressure from about 500 millibars to less than about 10 millibars (e.g., 0.001 millibar). Further, forming the hermetic cavity according to the improved method can advantageously reduce the height of the device package relative to eutectic bonding. For example, the improved method can reduce the height of the device package from about 600 micrometers to about 350 micrometers. Moreover, forming the hermetic cavity according to the improved method can advantageously reduce costs relative eutectic bonding and increase the flexibility of packing MEMS devices on a MEMS wafer relative eutectic bonding.

With reference to FIGS. 1A-C, cross-sectional and top views 100', 100", 100''' are respectively illustrated for some embodiments of a semiconductor structure including a MEMS device. The MEMS device is typically a pressure sensor, but other types of MEMS devices employing a vacuum are amenable. The semiconductor structure can be part of a wafer-level structure (i.e., a structure spanning multiple dies) before or after singulation, or part of a die-level structure (i.e., a structure limited to a single die). Further, the semiconductor structure includes an integrated circuit (IC) structure 102, a MEMS structure 104 arranged over and secured to the IC structure 102, and a cavity 106 arranged between the IC structure 102 and the MEMS structure 104.

IC devices 108 of the IC structure 102 are arranged over and/or within an IC substrate 110 of the IC structure 102. The IC substrate 110 is, for example, silicon and/or is, for example, a wafer. The IC devices 108 include active and/or passive components defining an IC, such as, for example, a logic circuit, an analog circuit, a mixed-signal circuit, and/or any other integrated circuit. The passive components include, for example, one or more of resistors, capacitors, inductors, and fuses. The active components include, for example, one or more transistors. In some embodiments, the IC structure 102 is a CMOS structure and the IC devices 108 are CMOS devices.

An interconnect structure 112 of the IC structure 102 is arranged over the IC substrate 110. A first interconnect dielectric layer 114 of the interconnect structure 112 surrounds one or more conductive lines 116 and one or more interconnect vias 118, of the interconnect structure 112. The interconnect vias 118 and the conductive lines 116 electrically couple the IC devices 108 to one or more electrodes 120 of the interconnect structure 112 arranged over the first interconnect dielectric layer 114. For readability, only a single conductive line 116, a single interconnect via 118, and a single electrode 120 are specifically labeled. The first interconnect dielectric layer 114 is, for example, an oxide, such as silicon dioxide, silicon nitride, or silicon oxynitride. The conductive lines 116, the interconnect vias 118, and the electrodes 120 are, for example, metal, such copper, aluminum, tungsten, gold, or silver, or polysilicon.

In some embodiments, an outgassing prevention layer 122 of the interconnect structure 112 is arranged between the first interconnect dielectric layer 114 and the electrodes 120. The outgassing prevention layer 122 prevents gases (e.g., oxygen, carbon dioxide, other gases, and/or any combinations thereof) from outgassing from the first interconnect dielectric layer 114 and/or other components of the interconnect structure 112 below the outgassing prevention layer 122. The outgassing prevention layer 122 typically has a gas permissibility lower than that of the first interconnect dielectric layer 114 and/or other components of the interconnect structure 112. The outgassing prevention layer 122 includes one or more layers corresponding to, for example, one or more of silicon nitride, silicon oxynitride, silicon carbide, silicon oxycarbide, and silicon carbon nitride. In some embodiments, the outgassing prevention layer 122 includes a multilayer oxide-nitride-oxide film and/or a silicon nitride layer.

A second interconnect dielectric layer 124 of the interconnect structure 112 is arranged over the first interconnect dielectric layer 114 around the cavity 106, and over and between electrodes 120 outside the cavity 106. In some embodiments, the second interconnect dielectric layer 124 includes one or more channels 126a, 126b extending laterally from the cavity 106. The channels 126 are, for example, arranged in a top surface of the second interconnect dielectric layer 124 and/or extend, for example, over corresponding electrodes 120. In some embodiments, the second interconnect dielectric layer 124 further includes one or more interconnect holes 128 and/or an interconnect trench 130 surrounding the cavity 106. The interconnect holes 128 and/or the interconnect trench 130 are, for example, arranged over corresponding electrodes 120. For readability, only a single interconnect hole 128 is specifically labeled. The second interconnect dielectric layer 124 is, for example, an oxide, such as silicon dioxide, silicon nitride, or silicon oxynitride.

In some embodiments, a gas getter structure 132 of the IC structure 102 is arranged over the interconnect structure 112 in the cavity 106. The gas getter structure 132 is configured to absorb and/or consume gases within the cavity 106. The gas getter structure 132 includes one or more layers corresponding to, for example, one or more of aluminum, copper, tungsten, cobalt, platinum, silicon, germanium, titanium, tantalum, gold, nickel, tin, and other suitable metallic materials. For example, the gas getter structure 132 includes a copper layer, which is prone to reacting with and absorbing oxygen in the cavity 106.

A MEMS substrate 136 of the MEMS structure 104 is arranged over and secured to the second interconnect dielectric layer 124. In some embodiments, the MEMS substrate 136 includes a recess in a bottom surface corresponding to the cavity 106. The MEMS substrate 136 is secured to the second interconnect dielectric layer 124 by, for example, a fusion bond at an interface between the MEMS substrate 136 and the second interconnect dielectric layer 124. A MEMS device structure 138 is arranged within the MEMS substrate 136.

In some embodiments, such as for a MEMS pressure sensor device, the MEMS device structure 138 includes a flexible membrane 140 arranged over the cavity 106. During operation of the MEMS pressure sensor device, the flexible membrane 140 deflects in proportion to the difference between the environmental pressure and a reference pressure in the cavity 106. Capacitive coupling between the flexible membrane 140 and the electrodes 120 is then used to measure the deflection. The thickness of the flexible membrane 140 can be decreased to increase the amount of deflection.

In other embodiments, such as for a MEMS chemical or biological sensor device, the MEMS device structure 138 includes a mechanism for releasing the pressure in the cavity 106. During operation of the MEMS chemical/biological sensor device, the cavity 106, which is sealed (described hereafter), is opened to vacuum biological and chemical agents into the cavity 106. The vacuumed biological or chemical agents then interact with the electrodes 120 in the cavity 106, which have surface treatments to act as sensing plates.

One or more MEMS holes 142, 144 of the MEMS substrate 136 extend through the MEMS substrate 136. For readability, only some of the MEMS holes 142, 144 are specifically labeled. Further, in some embodiments, a MEMS trench 146 of the MEMS substrate 136 surrounds the cavity 106 and corresponds to the interconnect trench 130. The MEMS substrate 136 includes, for example, one or more layers corresponding to one or more of silicon, polysilicon, amorphous silicon, aluminum copper, oxide, and silicon nitride. The MEMS substrate 136 is, for example, a wafer and/or has, for example, a thickness of 0.1-40 micrometers.

One or more vent holes 144 of the MEMS holes 142, 144 extend through the MEMS substrate 136 in fluid communication with the cavity 106. The vent holes 144 are typically in direct fluid communication with the cavity 106 or in indirect fluid communication with the cavity 106 by way corresponding channels 126. The vent holes 144 have, for example, a footprint (i.e., the projection of the vent hole 144 on a top surface of the IC structure 102) with a minimum dimension of about 0.1-2 micrometers and/or less than or equal to about one twentieth of the thickness of the MEMS substrate 136. Further, the footprint of the vent holes 144 can have any shape, such as, for example, a symmetrical, rectangular shape, or a long and narrow shape.

One or more plugs 148 of the MEMS structure 104 are arranged over corresponding vent holes 144 to hermetically seal the cavity 106 with a reference pressure. Only a single plug 148 is specifically labeled for readability. As discussed hereafter, the plugs 148 are formed by a film deposition device that forms a film in a vacuum having the reference pressure. The film deposition device is, for example, a CVD, PVD or E-bram device. The plugs 148 include one or more layers 150a, 150b corresponding to, for example, one or more of aluminum, titanium, oxide, silicon nitride, silicon oxynitride, amorphous silicon, and germanium.

In some embodiments, the plugs 148 include a first plug layer 150a corresponding a metal and a second plug layer 150b corresponding to a multilayer oxide-nitride-oxide film and a silicon nitride layer. Further, the plugs 148 have, for example, a thickness greater than about half of the minimum dimension of the vent holes 144. For example, the plugs 148 have a thickness greater than about 500 Angstroms or 0.1 micrometers. Without such a thickness, the plugs 148 include a recess over the corresponding vent holes 144. Further, in some embodiments, the plugs 148 include corresponding protrusions 151 lining the sidewalls of the corresponding vent holes 144 and tapering towards the interconnect structure 112. The plugs 148 typically extend from about even with a top surface of the MEMS substrate 136.

Advantageously, sealing the cavity 106 as described above reduces the reference pressure in the cavity 106 relative to fusion bonding, and reduces the height of the device package relative to eutectic bonding. Further, sealing the cavity 106 as described above can advantageously reduce costs relative eutectic bonding and increase the flexibility of packing MEMS devices on a MEMS wafer relative eutectic bonding.

In some embodiments, one or more MEMS vias 152 extend through the MEMS substrate 136 and the second interconnect dielectric layer 124 to corresponding electrodes 120. For readability, only a single MEMS via 152 is specifically labeled. The MEMS vias 152 include corresponding interconnect holes 128 and corresponding MEMS holes 142. Further, the MEMS vias 152 include corresponding conductors 154 in electrical communication with the corresponding electrodes 120. The conductors 154 extend between a top surface of the MEMS substrate 136 and the corresponding electrodes 120. Further, the conductors 154 fill or otherwise line the corresponding MEMS and interconnect holes 128, 142 with one or more layers 156a, 156b corresponding to, for example, one or more of aluminum, titanium, oxide, silicon nitride, silicon oxynitride, amorphous silicon, and germanium. In some embodiments, the conductors 154 include a first, conductive layer 156a corresponding a metal and a second, dielectric layer 156b corresponding to a multilayer oxide-nitride-oxide film and a silicon nitride layer.

In some embodiments, where the MEMS substrate 136 and second interconnect dielectric layer 124 include the trenches 130, 146, a passivation layer 158 of the MEMS structure 104 lines the interconnect trench 130 and the MEMS trench 146. The passivation layer 158 can also line the conductors 154 of the MEMS vias 152 and/or the plugs 148. The passivation layer 158 serves to prevent gases and moisture from diffusing from the environment to the cavity 106. The thickness of the passivation layer 158 is, for example, 500 Angstroms or 0.1 micrometers thick and/or is, for example, silicon nitride.

Figure 2C:
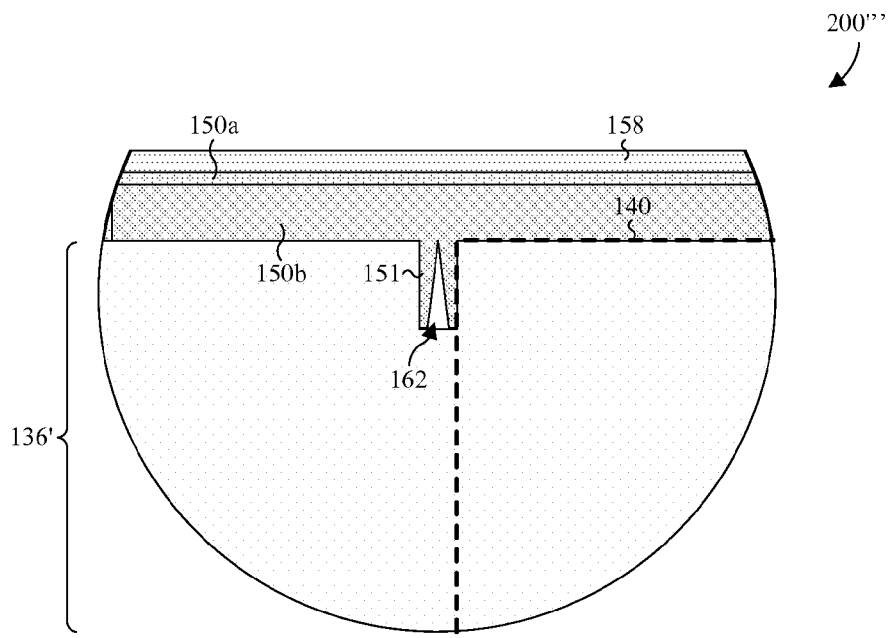
FIG. 2C illustrates an enlarged, cross-sectional view some embodiments of the semiconductor structure within the dashed circle of FIG. 2A.
Figure 2A:
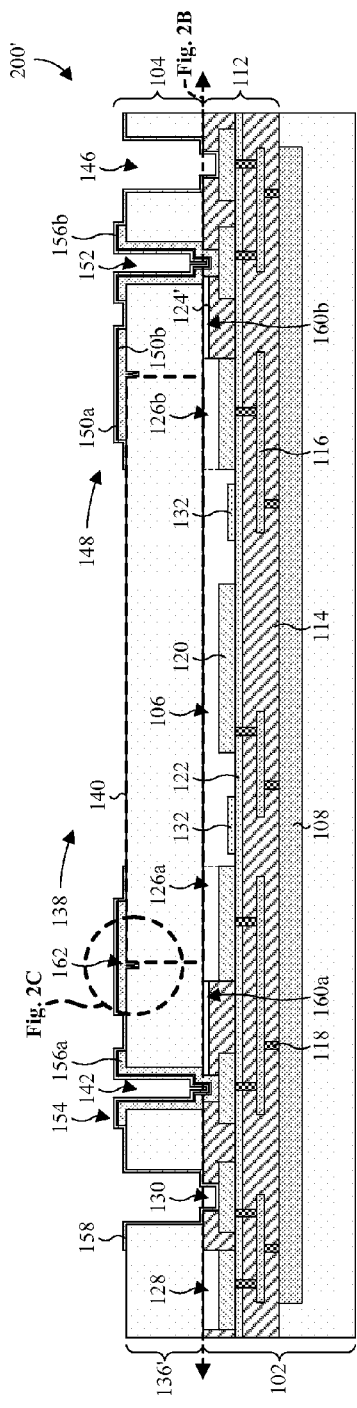
FIG. 2A illustrates a cross-sectional view of some embodiments of a semiconductor structure including a MEMS device with a high vacuum seal and shallow trenches according to aspects of the present disclosure.
Figure 2B:
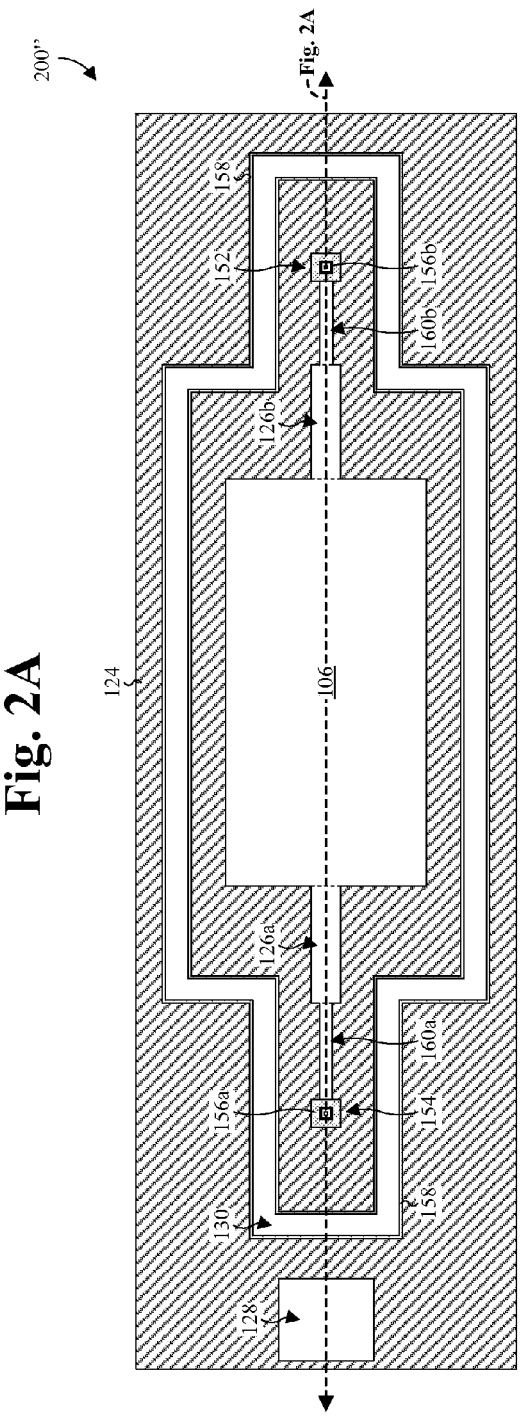
FIG. 2B illustrates a top view of some embodiments of the semiconductor structure of FIG. 2A.

With reference to FIGS. 2A-C, cross-sectional and top views 200', 200", 200''' are respectively illustrated for alternative embodiments of the semiconductor structure of FIGS. 1A-C. In contrast with the embodiments of FIGS. 1A-C, the alternative embodiments of FIGS. 2A-C include an alternative second interconnect dielectric layer 124' and an alternative MEMS substrate 136' without the vent holes 144.

The alternative MEMS substrate 136' is similar to the MEMS substrate 136, but typically excludes vent holes 144. The vent holes 144 are MEMS holes 142, 144 specifically formed for sealing the cavity 106. The vent holes 144 are to be contrasted with other MEMS holes 142 which are formed for another purpose, such as MEMS holes 142 corresponding to MEMS vias 152. In some embodiments, the alternative MEMS substrate 136' includes, for example, additional MEMS holes 162 extending partially into the alternative MEMS substrate 136' where the vent holes 144 of the MEMS substrate 136 were. For readability, only a single additional MEMS hole 162 is specifically labeled.

The alternative second interconnect dielectric layer 124' is similar to the second interconnect dielectric layer 124, but includes one or more shallow trenches 160a, 160b in a top surface. The shallow trenches 160 extend laterally from the cavity 106 or the channels 126 to corresponding MEMS holes 142, 144, which correspond to, for example, the MEMS vias 152. The shallow trenches 160 have, for example, a width (e.g., about less than one micrometer) and a depth (e.g., about 1000 Angstroms) less than the channels 126 and the cavity 106, and are therefore shallow.

The cavity 106 is sealed by lining the MEMS holes 142, 144 corresponding to the shallow trenches 160 with one or more layers covering the interface between the shallow trenches 160 and the corresponding MEMS holes 142, 144. For example, the cavity 106 is sealed by the first and second layers 156a, 156b of the conductors 154 of the MEMS vias 152. The layers suitably have a thickness greater than the depth of the shallow trenches 160. The cavity 106 is sealed with a reference pressure by forming the layers (e.g., of one or more of metal, a multilayer oxide-nitride-oxide film and a silicon nitride layer, aluminum, titanium, oxide, silicon nitride, silicon oxynitride, germanium, or amorphous silicon) in a vacuum having the reference pressure with a film deposition device. The film deposition device is, for example, a CVD, PVD or E-bram device. Advantageously, the use of shallow trenches 160 in lieu of vent holes 144 can bypass the etch loading from forming the vent holes 144. Further, the use of shallow trenches 160 can have a wider seal window.

Figure 3:
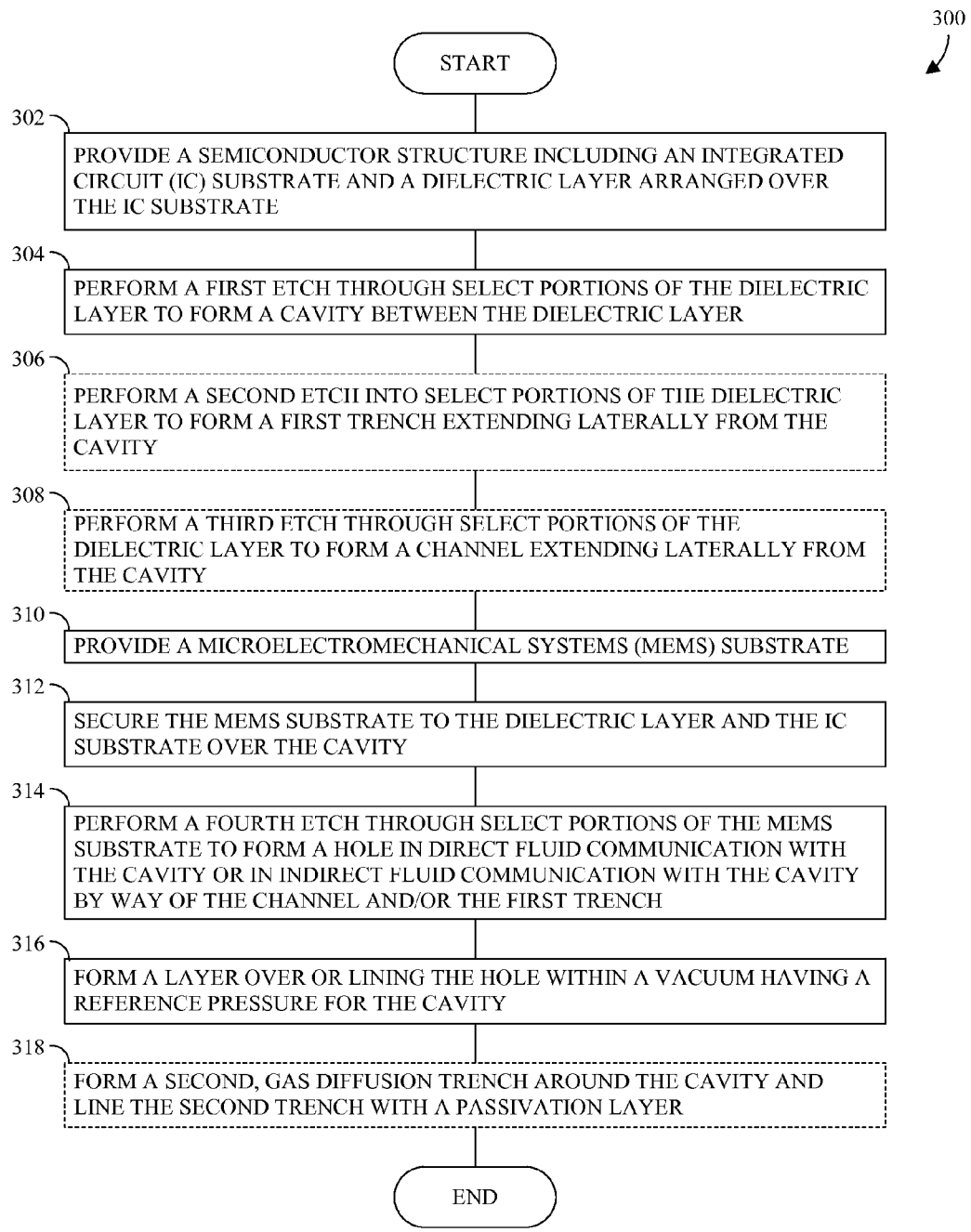
FIG. 3 illustrates a flow chart of some embodiments of a method of manufacturing a semiconductor structure including a MEMS device with a high vacuum seal according to aspects of the present disclosure.

With reference to FIG. 3, a flow chart 300 provides some embodiments of a method for manufacturing a semiconductor structure including a MEMS device with a high vacuum seal according to aspects of the present disclosure. Examples of the completed semiconductor structure are shown in FIGS. 1A-C and FIGS. 2A-C.

According to the method, a semiconductor structure including an IC substrate and a dielectric layer arranged over the IC substrate is provided (Action 302). The IC substrate is, for example, a wafer and/or is, for example, silicon.

A first etch is performed (Action 304) through select portions of the dielectric layer to form a cavity between the dielectric layer.

In some embodiments, a second etch is performed (Action 306) into select portions of the dielectric layer to form a first trench extending laterally.

In some embodiments, a third etch is performed (Action 308) into select portions of the dielectric layer to form a channel extending laterally from the cavity and, in some embodiments, extending to the first trench. The channel has, for example, a depth and a width respectively greater than the depth and the width of the first trench.

A MEMS substrate is provided (Action 310). The MEMS substrate is, for example, a wafer and/or is, for example, silicon.

The MEMS substrate is secured (Action 312) to the dielectric layer and the IC substrate over the cavity. The MEMS substrate is, for example, secured to the dielectric layer and the IC substrate by a fusion bond at the interface between the MEMS substrate and the dielectric layers.

A fourth etch is performed (Action 314) through select portions of the MEMS substrate to form a hole in direct fluid communication with the cavity or in indirect fluid communication with the cavity by way of the channel and/or the first trench. In some embodiments, the hole is a vent hole specifically formed sealing the cavity. In other embodiments, the hole is a via hole formed specifically for a via.

A layer is formed (Action 316) over or lining the hole within a vacuum having a reference pressure for the cavity. In some embodiments, the layer is part of a plug, which is specifically formed to seal the cavity. In other embodiments, the layer is part of a via, which is formed for a purpose other than sealing the cavity, but also seals the cavity.

A second, gas diffusion trench is formed (Action 316) around the cavity, and the gas diffusion trench is lined with a passivation layer, to prevent diffusion of gases from the environment into the cavity.

While the disclosed methods (e.g., the method described by the flowchart 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 4-30, cross-sectional views of some embodiments of a semiconductor structure at various stages of manufacture are provided to illustrate the method. The semiconductor structure includes a MEMS device with a high vacuum seal according to aspects of the present disclosure. Although FIGS. 4-30 are described in relation to the method, it will be appreciated that the structures disclosed in FIGS. 4-30 are not limited to the method, but instead may stand alone as structures independent of the method. Similarly, although the method is described in relation to FIGS. 4-30, it will be appreciated that the method is not limited to the structures disclosed in FIGS. 4-30, but instead may stand alone independent of the structures disclosed in FIGS. 4-30.

FIGS. 4-12 illustrate cross-sectional views 400-1200 of some embodiments corresponding to Action 302.

Figure 4:
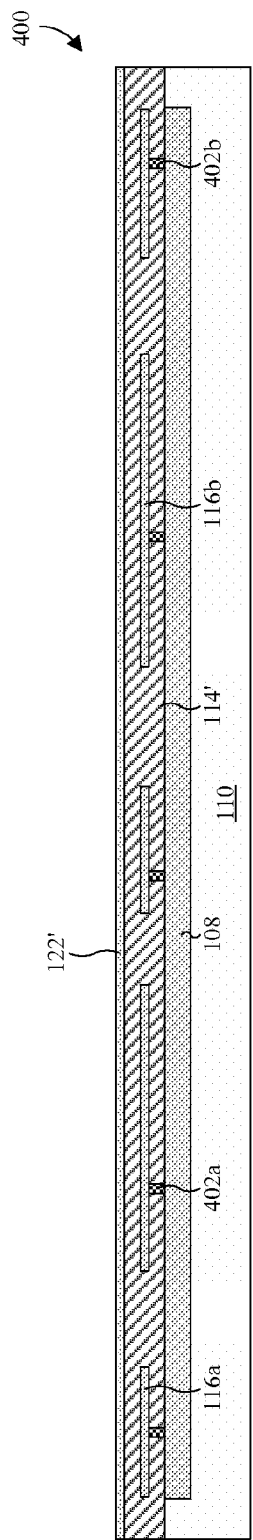

As shown by FIG. 4, a semiconductor structure is provided. The semiconductor structure includes an IC substrate 110 with IC devices 108 arranged over or within the IC substrate 110. The IC substrate 110 is, for example, silicon and/or is, for example, a wafer. Further, the semiconductor structure includes a first dielectric layer 114' arranged over the IC substrate 110 and the IC devices 108, and includes one or more first vias 402a, 402b and one or more conductive lines 116a, 116b arranged within the first dielectric layer 114'. The first vias 402 electrically couple the conductive lines 116 with the IC devices 108. For readability, only some of the first via 402 and some of the conductive line 116 are specifically labeled. The first dielectric layer 114' is, for example, an oxide, such as silicon dioxide, silicon nitride, or silicon oxynitride. The conductive lines 116, and the first vias 402 are, for example, metal, such copper, aluminum, tungsten, gold, or silver, or polysilicon. The semiconductor structure, including the IC devices 108, can be formed according to a CMOS manufacturing process.

Also shown by FIG. 4, an outgassing prevention layer 122' is formed over the first dielectric layer 114'. The outgassing prevention layer 122' prevents gases from outgassing from the first dielectric layer 114'. The outgassing prevention layer 122' includes one or more layers corresponding to, for example, one or more of silicon nitride, silicon oxynitride, silicon carbide, silicon oxycarbide, and silicon carbon nitride.

Figure 5:
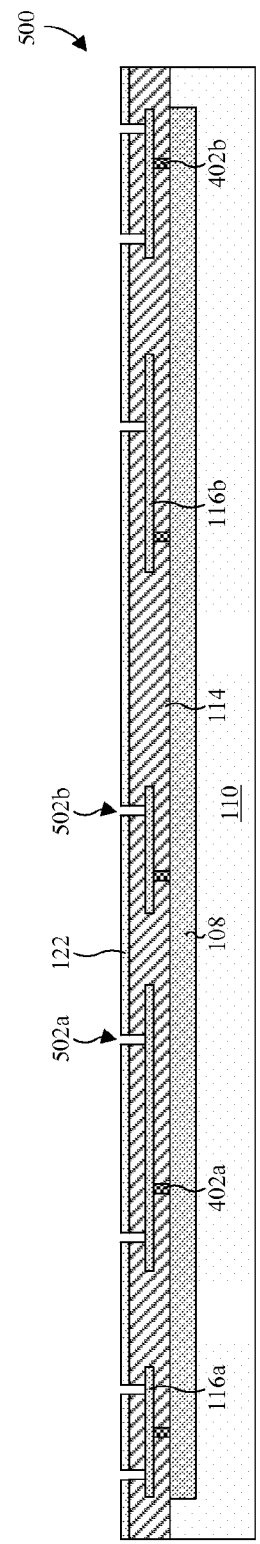
Figure 6:
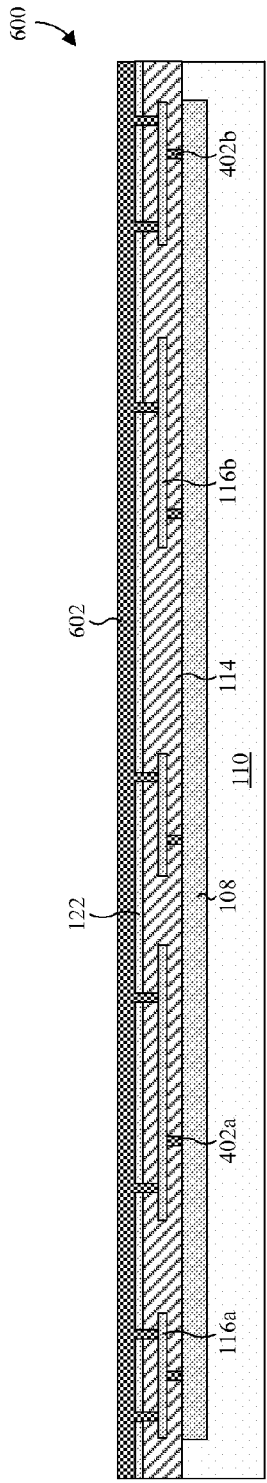

As shown by FIG. 5, a first etch is performed through select portions of the outgassing prevention layer 122' and the first dielectric layer 114' to the conductive lines 116 to form one or more first holes 502a, 502b. For readability, only some of the first holes 502 are specifically labeled. The first etch includes, for example, one or more sub-etches, each of which is anisotropic, isotropic, or a combination of anisotropic and isotropic, and each of which is a wet etch, a dry etch (e.g., a plasma etch), or a combination of wet and dry etches As shown by FIG. 6, a first conductive layer 602 is formed over the remaining outgassing prevention layer 122 and the remaining first dielectric layer 114 to fill the first holes 502. The first conductive layer 602 is, for example, a metal, such as copper, aluminum, gold, silver, nickel or tungsten, or polysilicon.

Figure 7:
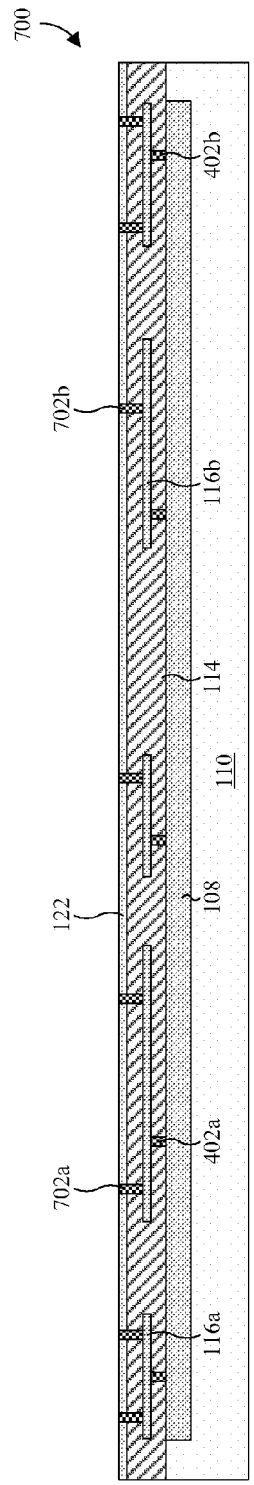

As shown by FIG. 7, a planarization and/or etch back is performed into the first conductive layer 602 to the remaining outgassing prevention layer 122 to form one or more second vias 702a, 702b. The second vias 702 electrically connect to the conductive lines 116 and extend from the conductive lines 116 to a top surface of the remaining outgassing prevention layer 122. For readability, only some of the second vias 702 are specifically labeled. The second vias 702 are, for example, metal, such as copper, aluminum, gold, silver, nickel or tungsten, or polysilicon.

Figure 8:
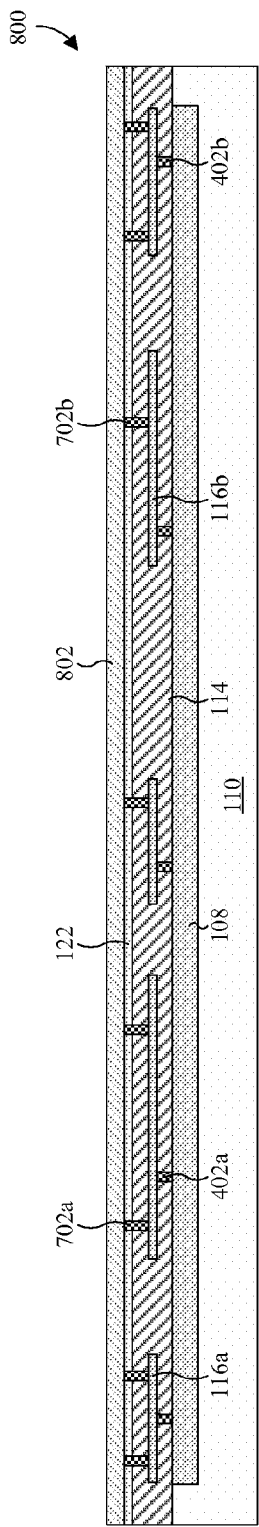

As shown by FIG. 8, a second conductive layer 802 is formed over the remaining outgassing prevention layer 122 and the second vias 702. The second conductive layer 802 is, for example, a metal, such as copper, aluminum, gold, silver, aluminum cooper, nickel or tungsten, or polysilicon.

Figure 9:
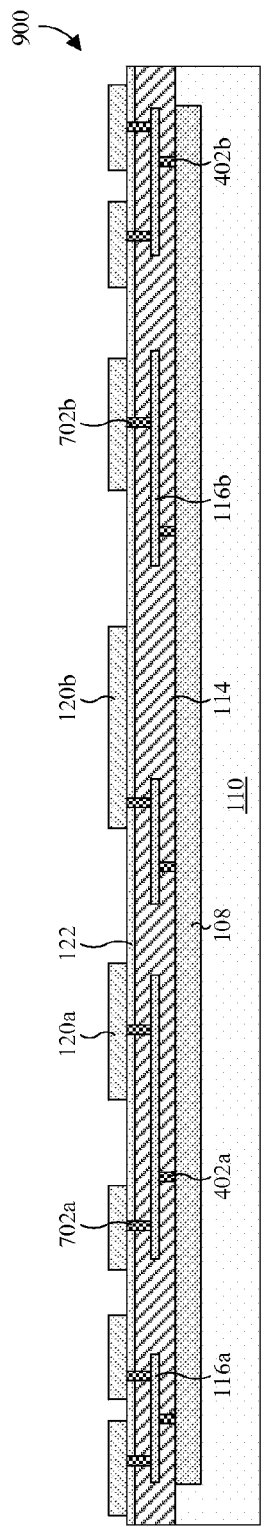
Figure 10:
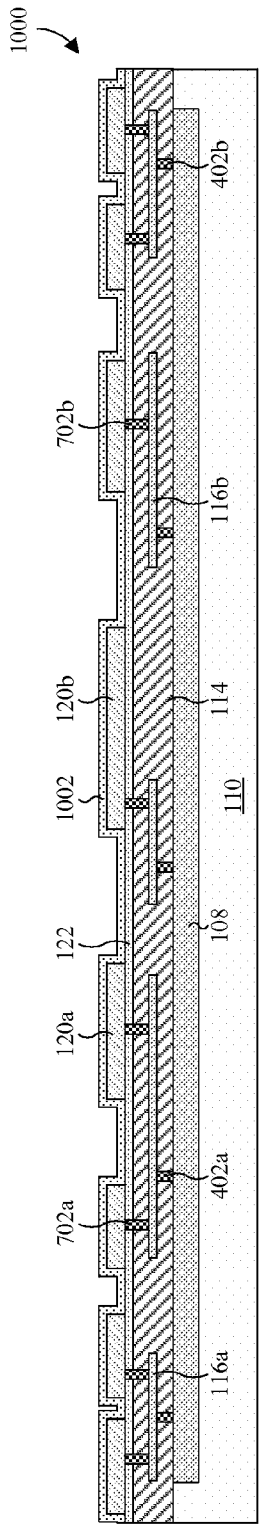

As shown by FIG. 9, a second etch is performed through select portions of the second conductive layer 802 to form electrodes 120a, 120b in electrical communication with corresponding second vias 702. For readability, only some of the electrodes 120 are specifically labeled. The second etch includes, for example, one or more sub-etches, each of which is anisotropic, isotropic, or a combination of anisotropic and isotropic, and each of which is a wet etch, a dry etch (e.g., a plasma etch), or a combination of wet and dry etches As shown by FIG. 10, a gas absorption layer 1002 is formed over the electrodes 120 and the remaining outgassing prevention layer 122. The gas absorption layer 1002 absorbs gases (e.g., through oxidation) and includes one or more layers corresponding to, for example, one or more of aluminum, copper, tungsten, cobalt, platinum, silicon, germanium, titanium, tantalum, gold, nickel, tin, and other suitable metallic materials.

Figure 11:
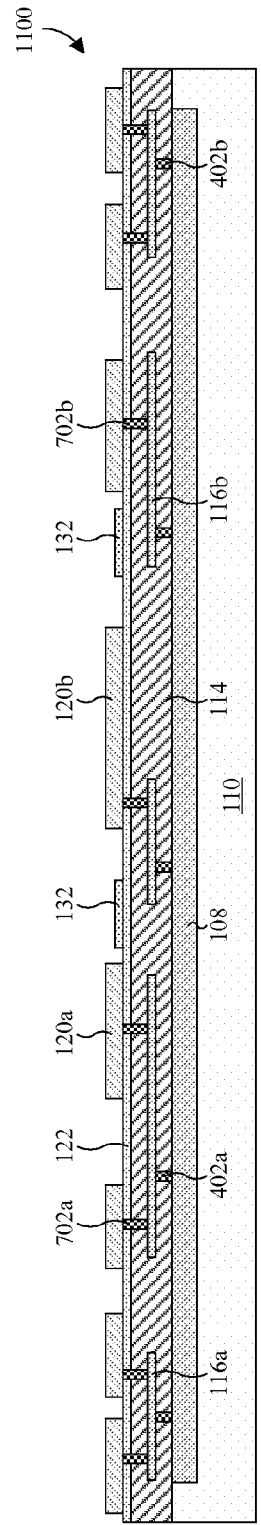
Figure 12:
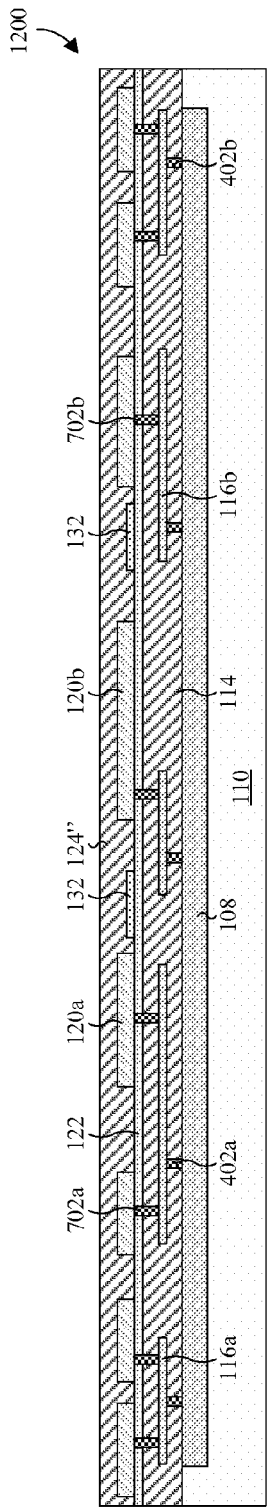

As shown by FIG. 11, a third etch is performed through select portions of the gas absorption layer 1002 to form a gas getter structure 132. The gas getter structure 132 absorbs gases and is localized to a region of the outgassing prevention layer 122 over which a cavity is subsequently formed. The third etch includes, for example, one or more sub-etches, each of which is anisotropic, isotropic, or a combination of anisotropic and isotropic, and each of which is a wet etch, a dry etch (e.g., a plasma etch), or a combination of wet and dry etches As shown by FIG. 12, a second dielectric layer 124" is formed over the remaining outgassing prevention layer 122, the electrodes 120, and the gas getter structure 132. The second dielectric layer 124" is, for example, an oxide, such as silicon dioxide, silicon nitride, or silicon oxynitride.

Figure 13:
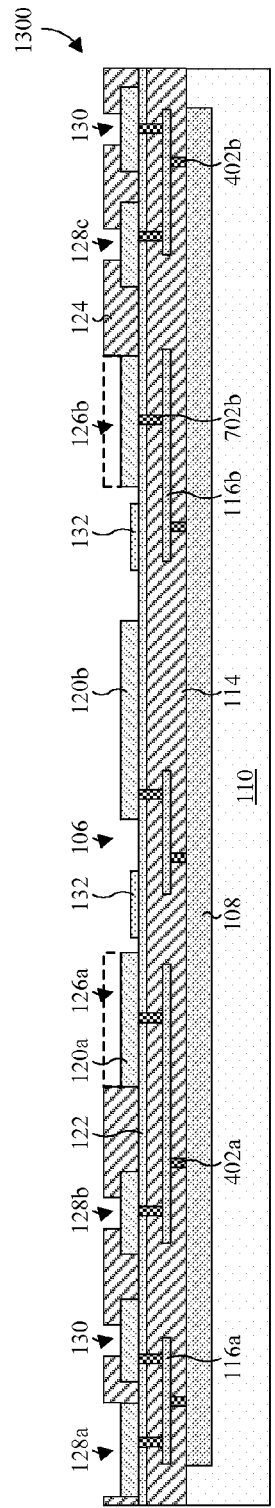

FIG. 13 illustrate cross-sectional views 1300 and 1400 of some embodiments corresponding to Actions 304 and 308. As shown by FIG. 13, a fourth etch is performed through select portions of the second dielectric layer 124" to the electrodes 120 and the remaining outgassing prevention layer 122 to form a cavity 106 between the remaining second dielectric layer 124 and the remaining outgassing prevention layer 122. The fourth etch also forms channels 126a, 126b extending laterally from the cavity 106, one or more second holes 128a, 128b outside the cavity 106, and a first trench 130 surrounding the cavity 106. One or more of the channels 126, the second holes 128 and the first trench 130 are formed over corresponding electrodes 120. The fourth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIG. 14 illustrates a cross-sectional view 1400 of some embodiments corresponding to Actions 310 and 312.

As shown by FIG. 14, an MEMS substrate 136" is provided. The MEMS substrate 136" includes, for example, one or more layers corresponding to one or more of silicon, polysilicon, amorphous silicon, aluminum copper, oxide, and silicon nitride. Further, the MEMS substrate 136" is, for example, a wafer and/or has, for example, a thickness of 0.1-40 micrometers.

Also shown by FIG. 14, the MEMS substrate 136" is secured to the IC substrate 110 and the remaining second dielectric layer 124 over the cavity 106. In some embodiments, the MEMS substrate 136" is secured by a fusion bond at the interface between the MEMS substrate 136" and the remaining second dielectric layer 124.

FIG. 15 illustrates a cross-sectional view 1500 of some embodiments corresponding to Action 314. As shown by FIG. 15, a fifth etch is performed through select portions of the MEMS substrate 136" to form one or more third holes 142a, 142b, 144a, 144b. The third holes 142, 144 include one or more vent holes 144 in direct fluid communication with the cavity 106 or indirect fluid communication with the cavity 106 by way of the channels 126. The vent holes 144 are typically in direct fluid communication with the cavity 106 or in indirect fluid communication with the cavity 106 by way of corresponding channels 126. The vent holes 144 have, for example, a footprint with a minimum dimension of about 0.1-2 micrometers and/or less than or equal to about one twentieth of the thickness of the remaining MEMS substrate 136'''. Further, the footprint of the vent holes 144 can have any shape, such as, for example, a symmetrical, rectangular shape, or a long and narrow shape. The fifth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIGS. 16 and 17 illustrate cross-sectional views 1600 and 1700 of some embodiments corresponding to Action 316.

Figure 16:
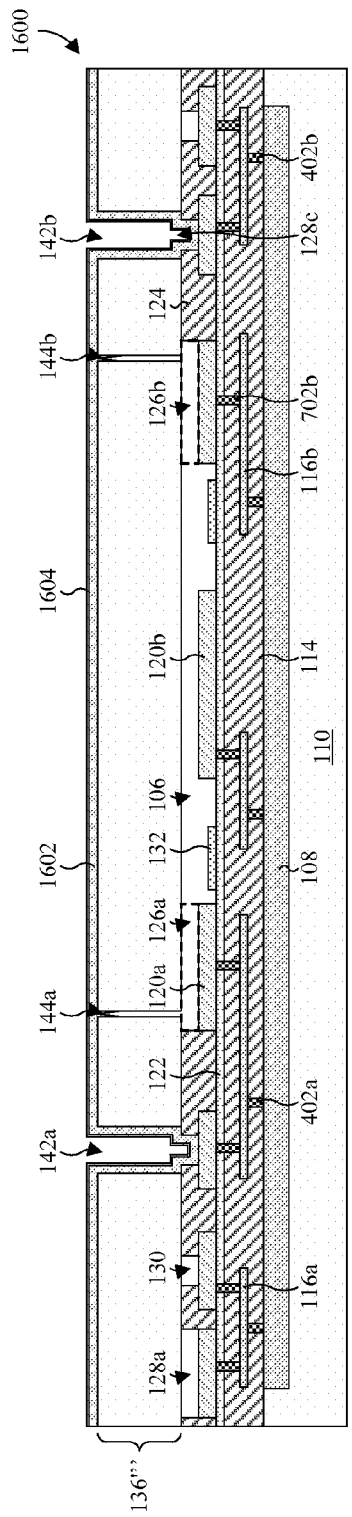

As shown by FIG. 16, a third conductive layer 1602 is formed over the remaining MEMS substrate 136''', and a third dielectric layer 1604 is formed over the third conductive layer 1602, to seal the cavity 106 with a reference pressure. The third conductive layer 1602 and, in some embodiments, the third dielectric layer 1604 are formed by a film deposition device which forms a film within a configurable pressure set to the reference pressure. Such film deposition devices include, for example, a CVD device, a PVD device, and an e-bram device. The third dielectric layer 1604 is, or otherwise includes, for example, an oxide, such as silicon dioxide or silicon oxynitride, or silicon nitride. The third conductive layer 1602 is, or otherwise includes, for example, a metal, such as aluminum, titanium, copper, gold, silver, nickel or tungsten, or polysilicon.

Figure 17:
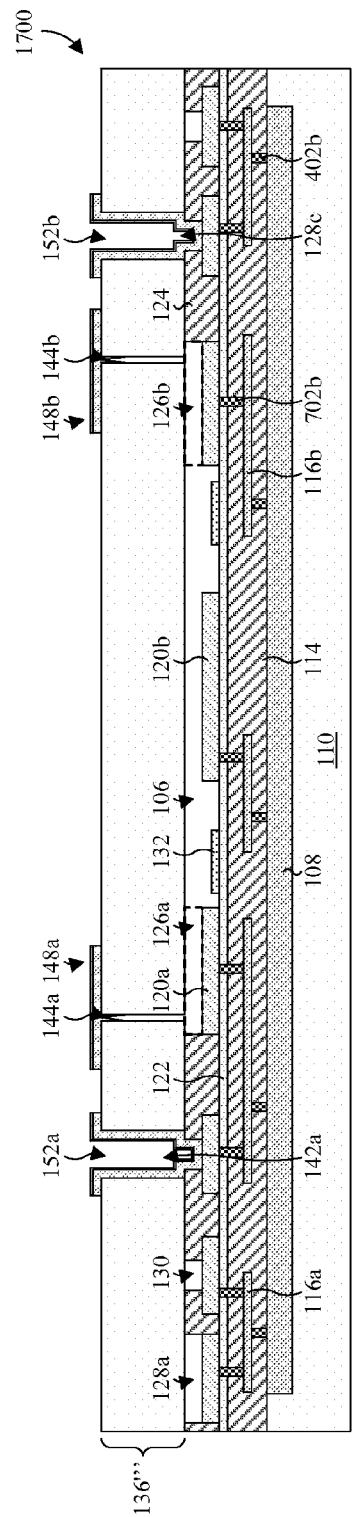

As shown by FIG. 17, a sixth etch is performed through select portions of the third conductive layer 1602 and the third dielectric layer 1604 to form one or more plugs 148a, 148b over corresponding vent holes 144. The sixth etch further forms one or more third vias 152a, 152b extending through the remaining MEMS substrate 136''' and the remaining second dielectric layer 124, and electrically coupling with corresponding electrodes 120 through corresponding second and third holes 128, 142. The sixth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIGS. 18-20 illustrate cross-sectional views 1800-2000 of some embodiments corresponding to Actions 318.

Figure 18:
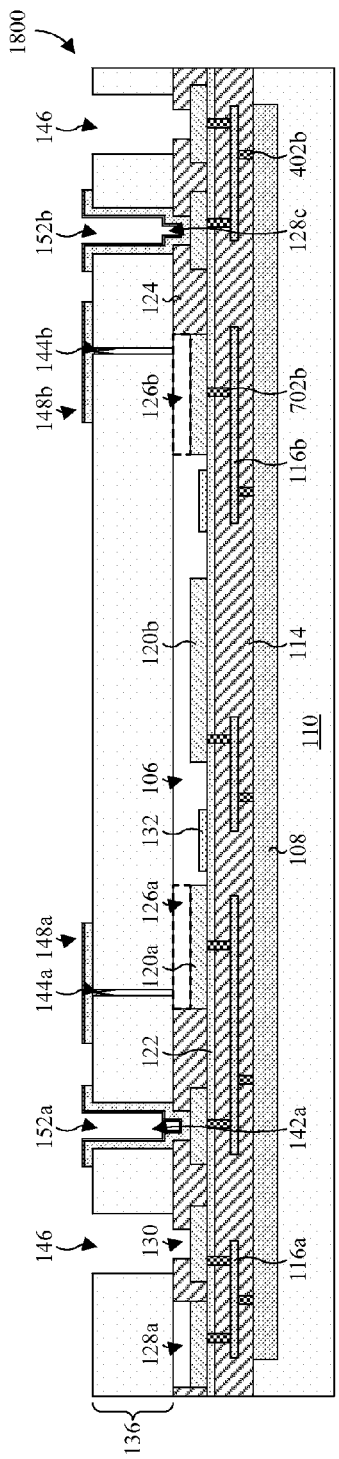
Figure 19:
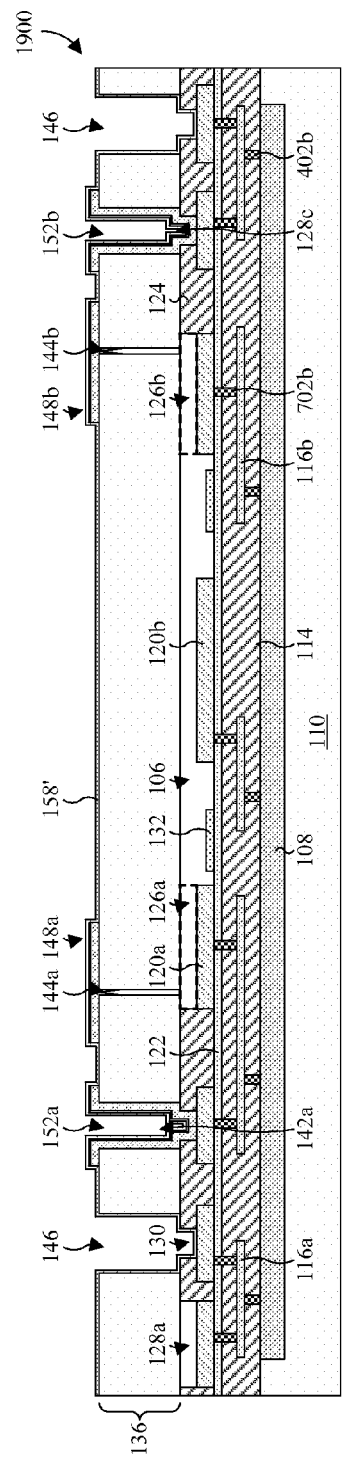

As shown by FIG. 18, a seventh etch is performed through select portions of the remaining MEMS substrate 136''' to form a second trench 146 around the cavity 106 and over the first trench 130. The seventh etch includes, for example, one or more sub-etches, each of which is anisotropic, isotropic, or a combination of anisotropic and isotropic, and each of which is a wet etch, a dry etch (e.g., a plasma etch), or a combination of wet and dry etches As shown by FIG. 19, a passivation layer 158' is formed over the remaining MEMS substrate 136, the third vias 152, the plugs 148, and the first and second trenches 130, 146. The passivation layer 158' serves to prevent gases and moisture from diffusing from the environment to the cavity 106. The thickness of the passivation layer 158 is, for example, 500 Angstroms or 0.1 micrometers thick and/or is, for example, silicon nitride, silicon dioxide, or silicon oxynitride.

Figure 20:
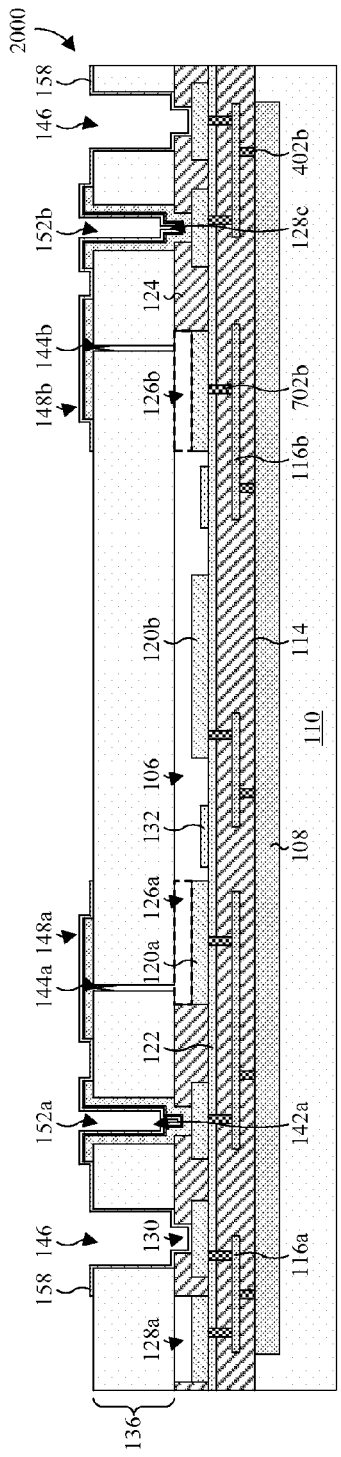

As shown by FIG. 20, an eighth etch is performed through select portions of the passivation layer 158' to remove portions over the cavity 106 and to remove portions outside the region surrounded by the first and second trenches 130, 146. The eighth etch includes, for example, one or more sub-etches, each of which is anisotropic, isotropic, or a combination of anisotropic and isotropic, and each of which is a wet etch, a dry etch (e.g., a plasma etch), or a combination of wet and dry etches With reference to FIGS. 21-30, cross-sectional views 2100-30 of alternative embodiments corresponding to Actions 304-318 are illustrated. In contrast with the embodiments of FIGS. 13-20, the cavity 106 is sealed without the use of vent holes 144.

Figure 21:
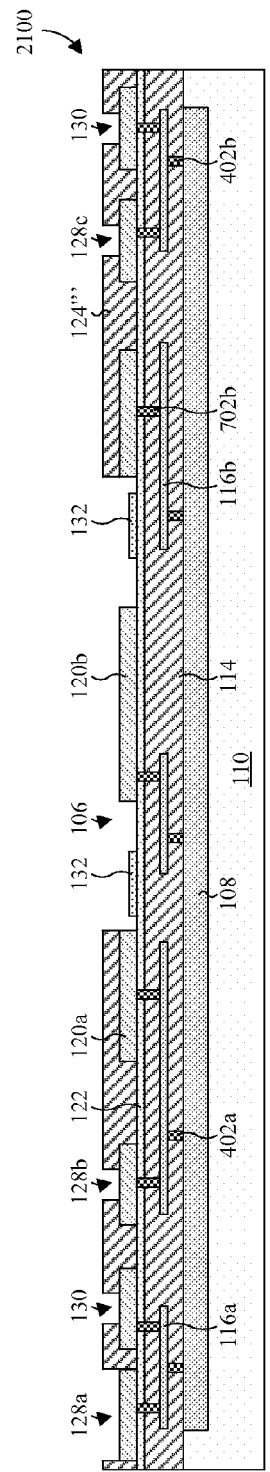
Figure 22:
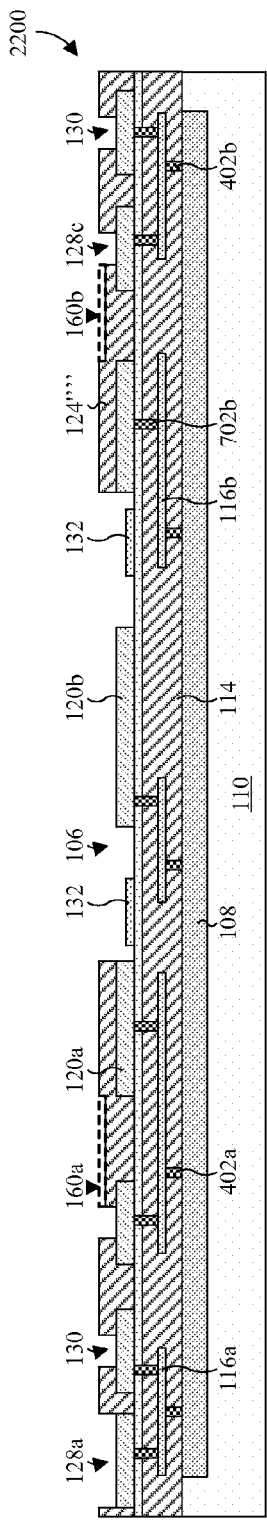
Figure 23:
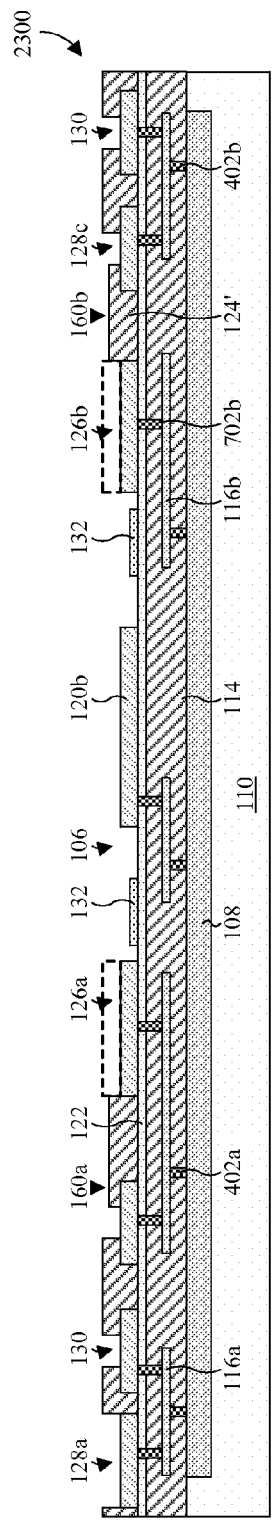
Figure 24:
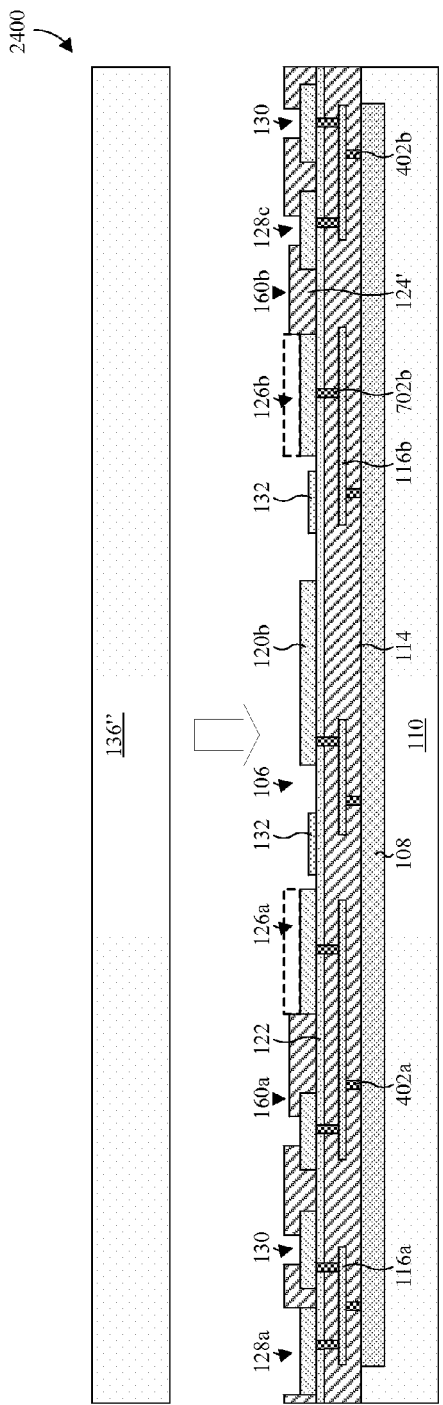

FIG. 21 illustrates a cross-sectional view 2100 of some embodiments corresponding to Action 304. As shown by FIG. 21, an alternative fourth etch is performed through select portions of the second dielectric layer 124'' to the electrodes 120 and the remaining outgassing prevention layer 122 to form a cavity 106 between the remaining second dielectric layer 124''' and the remaining outgassing prevention layer 122. The alternative fourth etch also forms one or more second holes 128a, 128b outside the cavity 106 and a first trench 130 surrounding the cavity 106. One or more of the second holes 128 and the first trench 130 are formed over corresponding electrodes 120. The alternative fourth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIG. 22 illustrates a cross-sectional view 2200 of some embodiments corresponding to Action 306. As shown by FIG. 22, an alternative fifth etch is performed through select portions of the remaining second dielectric layer 124''' to form one or more alternative second trenches 160a, 160 extending laterally from corresponding second holes 128, typically towards the cavity 106. In some embodiments, the alternative second trenches extend to the cavity 106. The alternative fifth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIG. 23 illustrates a cross-sectional view 2300 of some embodiments corresponding to Action 308. As shown by FIG. 23, an alternative sixth etch is performed through select portions of the remaining second dielectric layer 124'''' to form one or more channels 126a, 126b extending laterally from the cavity 106 to the alternative second trenches 160. The alternative sixth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIG. 24 illustrates a cross-sectional view 2400 of some embodiments corresponding to Actions 310 and 312. As shown by FIG. 24, an MEMS substrate 136'' is provided. Also shown by FIG. 24, the MEMS substrate 136'' is secured to the IC substrate 110 and the remaining second dielectric layer 124' over the cavity 106. In some embodiments, the MEMS substrate 136'' is secured by a fusion bond at the interface between the MEMS substrate 136'' and the remaining second dielectric layer 124'.

Figure 25:
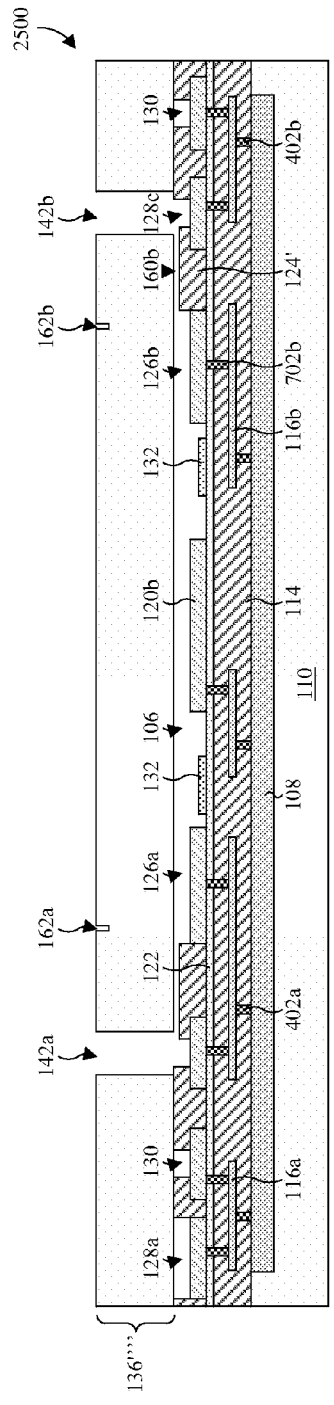

FIG. 25 illustrates a cross-sectional view 2500 of some embodiments corresponding to Action 314. As shown by FIG. 25, an alternative seventh etch is performed through and/or into select portions of the MEMS substrate 136'' to form one or more third holes 142a, 142b, 162a, 162b. The alternative seventh etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIGS. 26 and 27 illustrate cross-sectional views 2600 and 2700 of some embodiments corresponding to Action 316.

Figure 26:
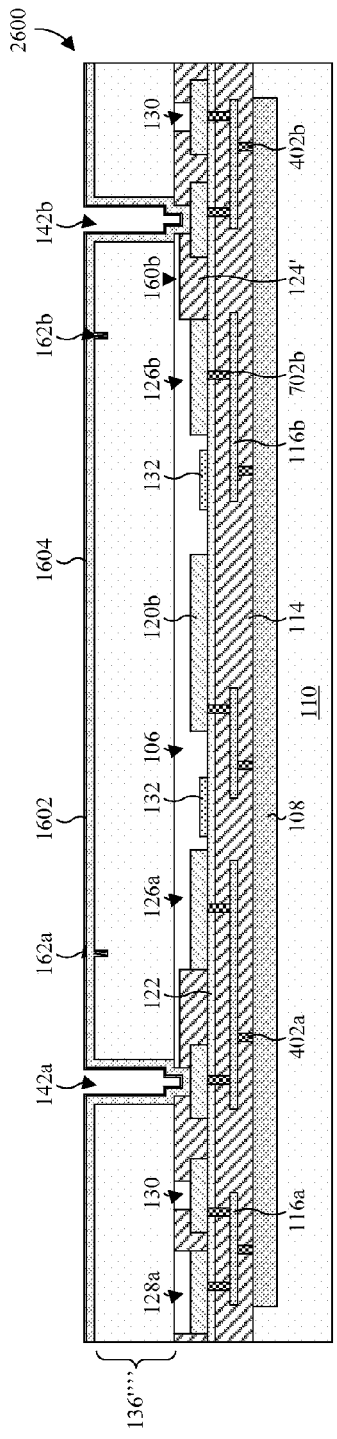

As shown by FIG. 26, an third conductive layer 1602 is formed over the remaining MEMS substrate 136'''', and a third dielectric layer 1604 is formed over the third conductive layer 1602, to seal the cavity 106 with a reference pressure. The third conductive layer 1602 and, in some embodiments, the third dielectric layer 1604 are formed by a film deposition device which forms a film within a configurable pressure set to the reference pressure. Such film deposition devices include, for example, a CVD device, a PVD device, and an e-bram device. Forming the third conductive layer 1602 and the third dielectric layer 1604 as described above seals the cavity 106 because the cavity 106 is in fluid communication with the external environment by way of the alternative second trenches 160 and corresponding third holes 142. The conformal formation of the third conductive layer 1602 and the third dielectric layer 1604 lines the corresponding third holes 142 and plugs the aperture in the walls of the corresponding third holes 142 by which the alternative second trenches 160 interface with the corresponding third holes 142.

Figure 27:
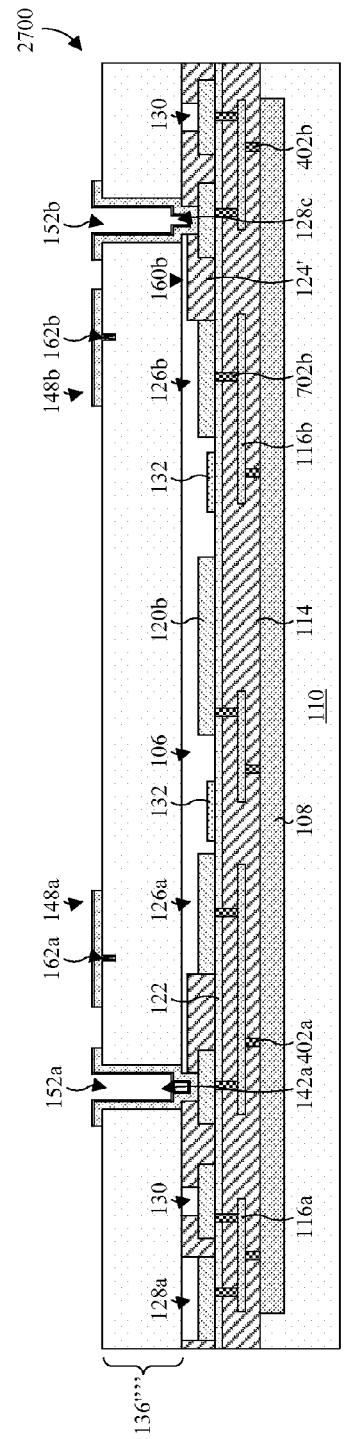

As shown by FIG. 27, an alternative eighth etch is performed through select portions of the third conductive layer 1602 and the third dielectric layer 1604 to form one or more plugs 148a, 148b over corresponding third holes 162. The alternative eighth etch further forms third vias 152a, 152b extending through the MEMS substrate 136 and the remaining second dielectric layer 124', and electrically coupling with corresponding electrodes 120 through corresponding second and third holes 128, 142. The alternative eighth etch includes, for example, one or more sub-etches, each of which is anisotropic, isotropic, or a combination of anisotropic and isotropic, and each of which is a wet etch, a dry etch (e.g., a plasma etch), or a combination of wet and dry etches FIGS. 28-30 illustrate cross-sectional views 2800-3000 of some embodiments corresponding to Actions 318.

Figure 28:
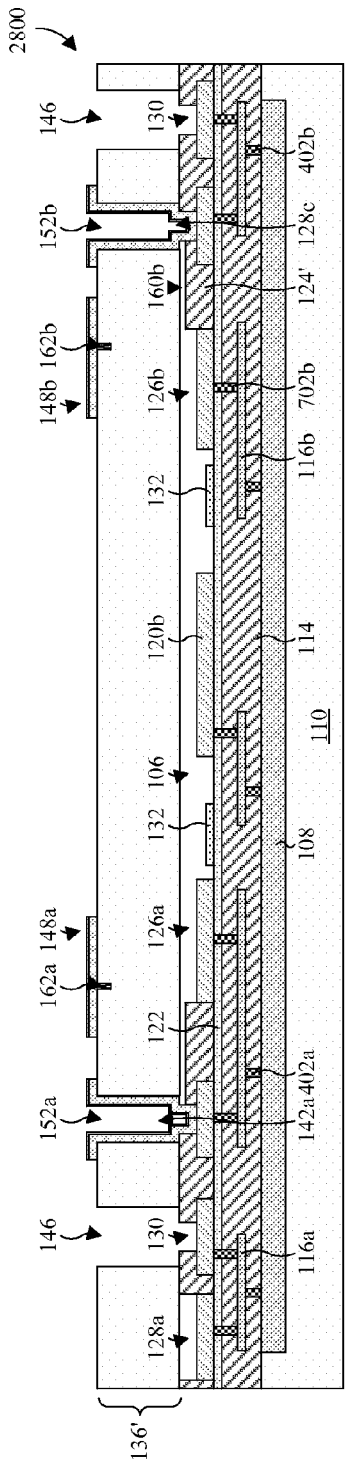
Figure 29:
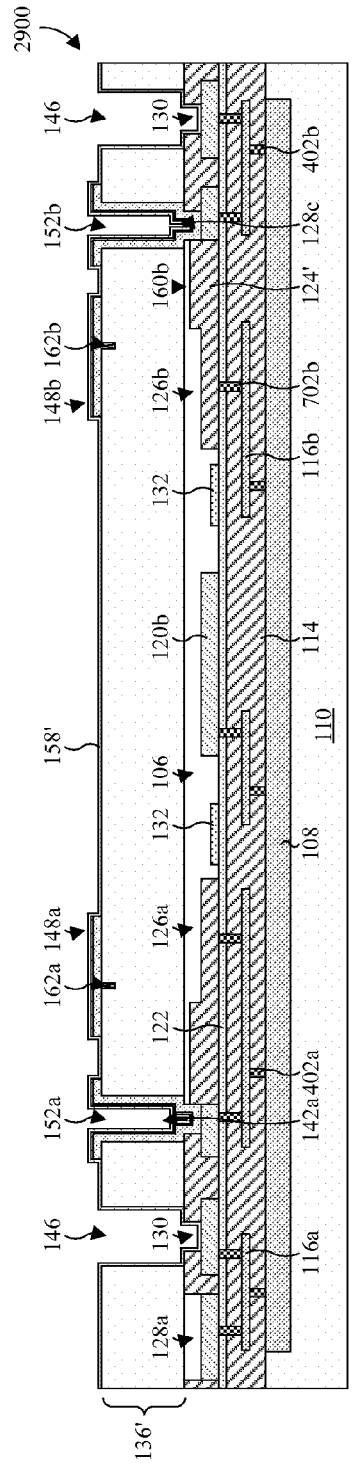

As shown by FIG. 28, a ninth etch is performed through select portions of the remaining MEMS substrate 136'''' to form a third trench 146 around the cavity 106 and over the first trench 130. The ninth etch includes, for example, one or more sub-etches, each of which is anisotropic, isotropic, or a combination of anisotropic and isotropic, and each of which is a wet etch, a dry etch (e.g., a plasma etch), or a combination of wet and dry etches As shown by FIG. 29, a passivation layer 158' is formed over the remaining MEMS substrate 136, the third vias 152, the plugs 148, and the first and third trenches 130, 146. The passivation layer 158' serves to prevent gases and moisture from diffusing from the environment to the cavity 106. The thickness of the passivation layer 158 is, for example, 500 Angstroms or 0.1 micrometers thick and/or is, for example, silicon nitrides, silicon dioxide, polysilicon, or silicon oxynitride.

Figure 30:
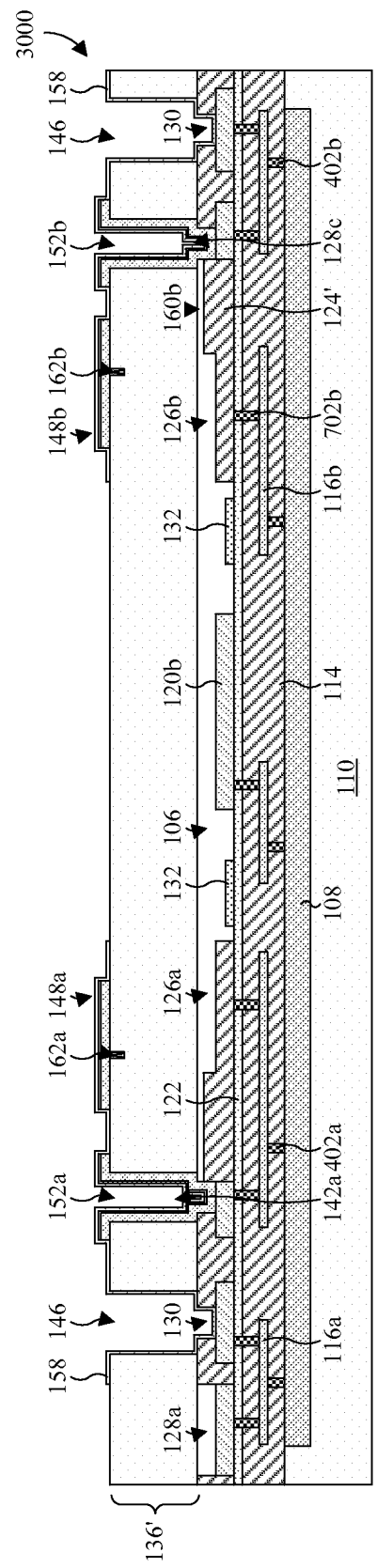

As shown by FIG. 30, a tenth etch is performed through select portions of the passivation layer 158' to remove portions over the cavity 106 and to remove portions outside the region surrounded by the first and third trenches 130, 146. The tenth etch includes, for example, one or more sub-etches, each of which is anisotropic, isotropic, or a combination of anisotropic and isotropic, and each of which is a wet etch, a dry etch (e.g., a plasma etch), or a combination of wet and dry etches Thus, as can be appreciated from above, the present disclosure provides a MEMS device. An IC substrate has a dielectric layer arranged over the IC substrate. A MEMS substrate is arranged over the IC substrate and the dielectric layer to define a cavity between the MEMS substrate and the IC substrate. The MEMS substrate includes a MEMS hole in fluid communication with the cavity and extending through the MEMS substrate. A sealing layer is arranged over or lining the MEMS hole to hermetically seal the cavity with a reference pressure.

In other embodiments, the present disclosure provides a method for manufacturing a MEMS device. A semiconductor structure is provided. The semiconductor structure includes an IC substrate, a dielectric layer arranged over the IC substrate, and a MEMS substrate arranged over the IC substrate and the dielectric layer to define a cavity between the MEMS substrate and the IC substrate. The MEMS substrate includes a MEMS hole in fluid communication with the cavity and extending through the MEMS substrate. A sealing layer is formed over or lining the MEMS hole to hermetically seal the cavity with a reference pressure while the semiconductor structure is arranged within a vacuum having the reference pressure.

In yet other embodiments, the present disclosure provides a MEMS device. An integrated circuit (IC) substrate has IC devices arranged within or other the IC substrate. An interconnect structure is arranged over the IC substrate and the IC devices. The interconnect structure includes a cavity. A MEMS substrate is arranged over the IC substrate and the interconnect structure. The MEMS substrate includes a MEMS hole in fluid communication with the cavity and extending through the MEMS substrate. A sealing layer is arranged over or lining the MEMS hole to hermetically seal the cavity with a reference pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) device, comprising:
an integrated circuit (IC) substrate having IC devices arranged within or over the IC substrate;
an interconnect structure arranged over the IC substrate and the IC devices, the interconnect structure including a cavity;
a MEMS substrate arranged over the IC substrate and the interconnect structure, wherein the MEMS substrate is a single, semiconductor material and defines a top surface of the cavity, wherein the MEMS substrate includes a MEMS hole in fluid communication with the cavity and extending through the MEMS substrate, wherein the MEMS hole opens into the cavity, or a lateral channel in fluid communication with the cavity, at a location even with the top surface of the cavity; and
a sealing layer covering or lining the MEMS hole, wherein the sealing layer contacts a top surface of the MEMS substrate.

2. The MEMS device according to claim 1, wherein the MEMS hole extends through the MEMS substrate from directly over the lateral channel and is in indirect fluid communication with the cavity through the lateral channel, and wherein the lateral channel extends laterally from the cavity.

3. The MEMS device according to claim 1, further comprising:
   a gas diffusion trench surrounding the cavity and extending through the MEMS substrate into the interconnect structure, wherein a bottom surface of the gas diffusion trench is defined by an electrode of the interconnect structure; and
   a passivation layer lining the gas diffusion trench, the passivation layer configured to prevent diffusion of gases into the cavity.

4. The MEMS device according to claim 1, wherein the MEMS hole is in indirect fluid communication with the cavity through the lateral channel, and wherein a electrode of the interconnect structure is arranged directly under the lateral channel to define a bottom surface of the lateral channel.

5. The MEMS device according to claim 1, wherein the MEMS substrate further comprises a flexible membrane defining a top surface of the cavity, and wherein the MEMS device further comprises:
   an IC comprising the IC substrate and the interconnect structure, wherein the IC and the flexible membrane are respectively rigid and flexible relative to one another; and
   an electrode arranged on a bottom surface of the cavity, wherein the flexible membrane is capacitively coupled to the electrode.

6. The MEMS device according to claim 1, wherein the interconnect structure includes a dielectric layer comprising a pair of first opposing sidewalls and a pair of second opposing sidewalls, wherein the first and second opposing sidewalls define respective sidewalls of the cavity and respective sides of a rectangle, wherein the channel extends laterally away from the second opposing sidewalls at an angle relative to the second opposing sidewalls, and wherein the MEMS substrate contacts top edges respectively of the first and second opposing sidewalls and is continuous respectively from and to contact with the top edges.

7. A microelectromechanical systems (MEMS) device, comprising:
   an integrated circuit (IC) substrate having a dielectric layer arranged over the IC substrate;
   a MEMS substrate arranged over the IC substrate and the dielectric layer to define a cavity between the MEMS substrate and the IC substrate, wherein the MEMS substrate includes a MEMS hole in fluid communication with the cavity and extending through the MEMS substrate, and wherein the MEMS hole is in indirect fluid communication with the cavity through a channel that extends laterally from the cavity;
   an electrode defining a bottom surface of the channel; and
   a sealing layer arranged over or lining the MEMS hole to hermetically seal the cavity with a reference pressure;
   wherein the dielectric layer comprises a pair of first opposing sidewalls and a pair of second opposing sidewalls, wherein the first and second opposing sidewalls define respective sidewalls of the cavity and are arranged end-to-end in a rectangle, and wherein the channel is laterally spaced between the first opposing sidewalls and extends laterally away from the second opposing sidewalls.

8. The MEMS device according to claim 7, wherein the MEMS substrate includes a flexible membrane arranged over the cavity and defining a top surface of the cavity, wherein the flexible membrane is capacitively coupled to a second electrode, and wherein the second electrode is arranged on a bottom surface of the cavity.

9. The MEMS device according to claim 7, further including:
   a second dielectric layer arranged over the IC substrate between the dielectric layer and the IC substrate; and
   an outgas prevention layer arranged over the IC substrate between the dielectric layer and the second dielectric layer, wherein the outgas prevention layer is configured to prevent outgassing from the second dielectric layer to the cavity.

10. The MEMS device according to claim 7, further including:
    a gas getter structure arranged within the cavity and configured to absorb gases within the cavity.

11. The MEMS device according to claim 7, wherein the sealing layer includes protrusions lining sidewalls of the MEMS hole and tapering towards the IC substrate.

12. The MEMS device according to claim 7, wherein the MEMS substrate includes a second MEMS hole, wherein the second MEMS hole extends through the MEMS substrate and is in indirect fluid communication with the cavity through a second channel, wherein the second channel is laterally spaced between the first opposing sidewalls, wherein the channel and the second channel extend laterally away from the second opposing sidewalls in opposite directions and along a common axis, and wherein the common axis has the same lateral orientation as the first opposing sidewalls.

13. The MEMS device according to claim 7, wherein a planar bottom surface of the MEMS substrate defines a top surface of the cavity, wherein the planar bottom surface contacts top edges respectively of the second opposing sidewalls and is continuous respectively from and to contact with the top edges, and wherein the MEMS hole opens into the channel at a location even with the planar bottom surface of the MEMS substrate.

14. The MEMS device according to claim 13, wherein the MEMS substrate is a single material, and wherein the sealing layer contacts a top surface of the MEMS substrate at a location laterally spaced from the MEMS hole.

15. A microelectromechanical systems (MEMS) device, comprising:
    a dielectric layer arranged over a semiconductor substrate and laterally surrounding a cavity overlying the semiconductor substrate, wherein the dielectric layer has a pair of first sidewalls and a pair of second sidewalls laterally spaced between the first sidewalls, and wherein the first and second sidewalls have the same lateral orientation;
    a MEMS substrate arranged over the dielectric layer and covering the cavity, wherein the MEMS substrate comprises a flexible membrane overlying the cavity, and further comprises a hole extending through the MEMS substrate from directly over a channel that extends laterally from the cavity, wherein the hole is arranged laterally adjacent to the flexible membrane and is in indirect fluid communication with the cavity through the channel, wherein a top surface of the channel is even with a top surface of the cavity, wherein the first sidewalls define opposite sidewalls respectively of the cavity and the second sidewalls define opposite sidewalls respectively of the channel, and wherein the hole is laterally between the second sidewalls; and
    a sealing layer covering or lining the hole and configured to seal the cavity with a reference pressure.

16. The MEMS device according to claim 15, wherein the channel has a width and a depth respectively smaller than a width and a depth of the cavity.

17. The MEMS device according to claim 15, further comprising:
- a gas diffusion trench laterally surrounding the cavity and extending through the MEMS substrate into the dielectric layer; and
- a passivation layer lining the gas diffusion trench, the passivation layer configured to prevent diffusion of gases into the cavity, wherein the passivation layer is conformal and extends continuously from the gas diffusion trench to the sealing layer to line the sealing layer.

18. The MEMS device according to claim 15, further comprising:
- an interconnect structure comprising the dielectric layer and covering the semiconductor substrate, wherein the interconnect structure comprises an electrode arranged directly under the channel to define a bottom surface of the channel; and
- integrated circuit (IC) devices arranged on the semiconductor substrate between the semiconductor substrate and the interconnect structure.

19. The MEMS device according to claim 15, wherein the dielectric layer has a pair of third sidewalls defining second opposite sidewalls respectively of the cavity, wherein the third sidewalls have an orientation that is at an angle relative to the first and second sidewalls of the dielectric layer, wherein first ends respectively of the third sidewalls respectively contact opposite ends of one of the first sidewalls, and wherein second ends respectively of the third sidewalls respectively contact opposite ends of another one of the first sidewalls.

20. The MEMS device according to claim 19, wherein the MEMS substrate comprises a second hole extending through the MEMS substrate from directly over a second channel, wherein the second channel extends laterally from the cavity on an opposite side of the cavity as the channel, wherein the channel and the second channel extend laterally away from the third sidewalls in opposite directions and begin respectively from the third sidewalls, and wherein the MEMS device further comprises:
- a second sealing layer covering or lining the second hole and configured to seal the cavity with the reference pressure.

* * * * *